United States Patent [19]

Taniguchi et al.

[11] Patent Number: 5,786,985
[45] Date of Patent: Jul. 28, 1998

[54] SEMICONDUCTOR DEVICE AND SEMICONDUCTOR DEVICE UNIT

[75] Inventors: Norio Taniguchi, Tanabe; Junichi Kasai, Kawasaki; Kazuto Tsuji, Kawasaki; Michio Sono, Kawasaki; Masanori Yoshimoto, Kawasaki; Katsuhiro Hayashida, Kawasaki; Mitsutaka Sato, Kawasaki; Hiroshi Yoshimura, Kawasaki; Tadashi Uno, Kawasaki; Kosuke Otokita, Kawasaki; Tetsuya Fujisawa, Kawasaki, all of Japan

[73] Assignee: Fujitsu Limited, Kawasaki, Japan

[21] Appl. No.: 749,734

[22] Filed: Nov. 15, 1996

Related U.S. Application Data

[63] Continuation of Ser. No. 460,803, Jun. 2, 1995, abandoned, which is a continuation-in-part of Ser. No. 252,522, Jun. 1, 1994, Pat. No. 5,684,675, which is a continuation of Ser. No. 152,883, Nov. 16, 1993, abandoned, which is a continuation of Ser. No. 889,955, May 29, 1992, abandoned.

[30] Foreign Application Priority Data

| May 31, 1991 | [JP] | Japan | 3-129776 |
| Aug. 22, 1994 | [JP] | Japan | 6-196926 |
| Dec. 14, 1994 | [JP] | Japan | 6-311021 |

[51] Int. Cl.⁶ ............................................ H05K 7/20
[52] U.S. Cl. .................. 361/707; 174/52.4; 257/724; 269/903; 361/773
[58] Field of Search ............... 174/16.3, 260, 174/52.1, 52.4; 211/41; 269/903; 206/593, 711, 718; 165/185, 80.3; 439/72, 485; 257/678, 705-707, 712, 713, 723, 724, 730, 731, 796; 361/600, 679, 704, 707, 709, 711, 717-731, 735, 760, 767, 773, 776, 796, 807, 809, 810; 248/27.1, 500, 310

[56] References Cited

U.S. PATENT DOCUMENTS

| 3,579,046 | 5/1971 | Jordan | 174/52.1 |
| 3,790,859 | 2/1974 | Schraeder et al. | 317/100 |
| 4,012,765 | 3/1977 | Lehner | 357/70 |
| 4,220,384 | 9/1980 | Clark et al. | 339/159 |
| 4,227,238 | 10/1980 | Saito | 361/415 |
| 4,420,795 | 12/1983 | Scholz | 361/810 |
| 4,498,123 | 2/1985 | Fuss et al. | 361/427 |
| 4,663,695 | 5/1987 | Ohkawara | 361/405 |
| 4,667,270 | 5/1987 | Yagi | 361/380 |
| 4,720,771 | 1/1988 | Horton | 361/388 |
| 4,727,456 | 2/1988 | Mehta et al. | 361/417 |
| 4,814,944 | 3/1989 | Sagawa et al. | 361/403 |
| 4,868,712 | 9/1989 | Woodman | 361/388 |
| 4,894,706 | 1/1990 | Sato et al. | 357/72 |
| 4,962,442 | 10/1990 | Clemens | 361/403 |
| 4,965,699 | 10/1990 | Jorden et al. | 361/387 |
| 5,049,973 | 9/1991 | Satriano | 357/70 |
| 5,050,039 | 9/1991 | Edfors | 361/388 |
| 5,057,969 | 10/1991 | Ameen et al. | 361/386 |
| 5,155,579 | 10/1992 | AuYeung | 357/81 |
| 5,266,834 | 11/1993 | Nishi | 257/706 |
| 5,305,179 | 4/1994 | Sono | 31/718 |
| 5,394,298 | 2/1995 | Sagisaka | 361/704 |
| 5,451,815 | 9/1995 | Taniguchi | 257/696 |

FOREIGN PATENT DOCUMENTS

| 0354708 | 2/1990 | European Pat. Off. |

*Primary Examiner*—Gerald P. Tolin
*Attorney, Agent, or Firm*—Staas & Halsey

[57] ABSTRACT

A semiconductor device is adapted to be mounted on a circuit substrate in an approximate vertical position. The semiconductor device includes a semiconductor chip, a stage having a first surface and a second surface opposite to the first surface, where the semiconductor chip is mounted on the first surface, a resin package encapsulating the semiconductor chip, where the resin package has upper and lower surfaces and side surfaces, a plurality of leads respectively having one end electrically connected to the semiconductor chip and another end extending downwardly from the lower surface of the resin package, and an upper extension, provided on the stage, extending upwardly from the upper surface of the resin package.

22 Claims, 31 Drawing Sheets

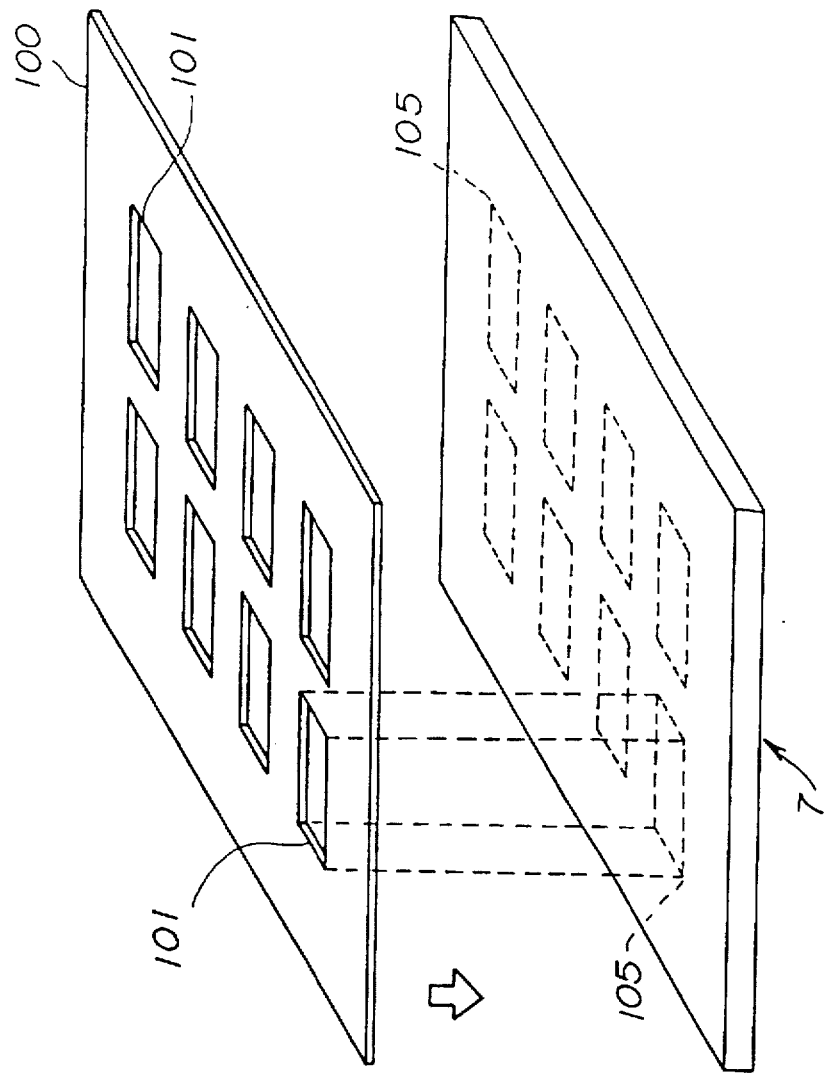

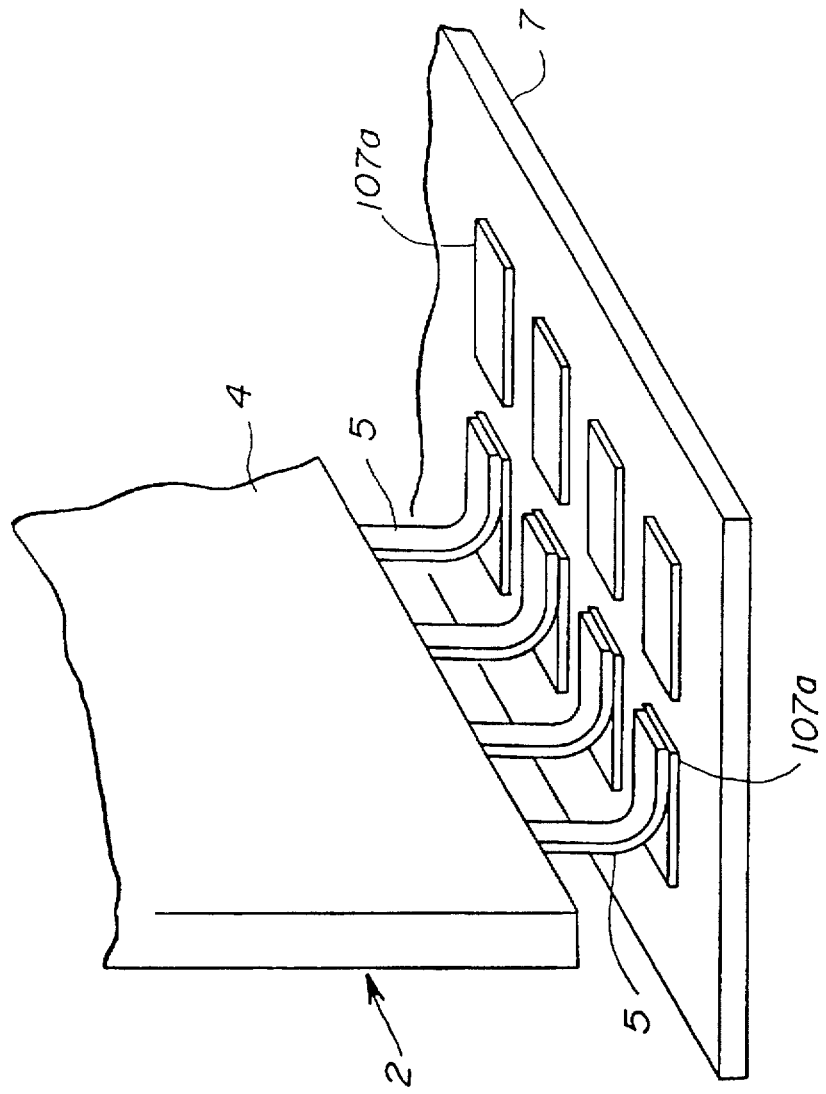

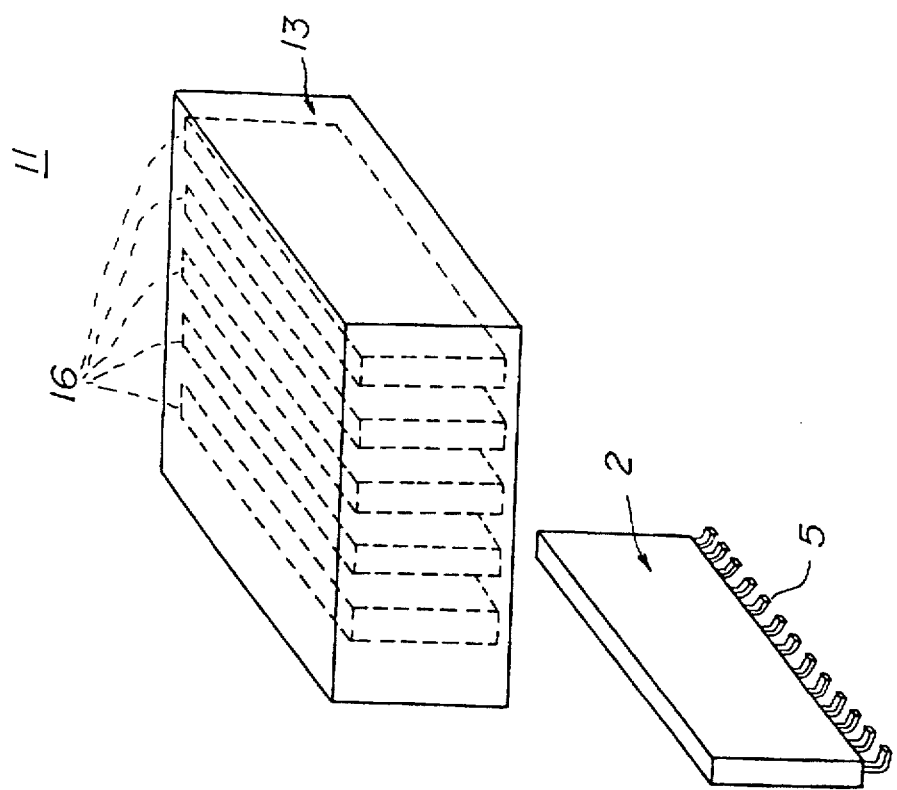

SEMICONDUCTOR DEVICE AND SEMICONDUCTOR DEVICE UNIT

This application is a continuation of application Ser. No. 08/460,803, filed Jun. 2, 1995, now abandoned, which is a continuation-in-part of application No. 08/252,522, filed Jun. 1, 1994, now U.S. Pat. No. 5,684,675, which is a continuation of application Ser. No. 08/152,883, filed Nov. 16, 1993, now abandoned, which is a continuation of application Ser. No. 07/889,955, filed May 29, 1992, now abandoned.

BACKGROUND OF THE INVENTION

The present invention generally relates to semiconductor devices, semiconductor device units and methods of mounting semiconductor devices, and more particularly to a semiconductor device and to a semiconductor device unit which are mounted in an approximately vertical position on a substrate, and to a method of mounting such semiconductor devices.

Recently, as the size of computer systems has further been reduced, there are demands to package semiconductor devices with a high density.

On the other hand, in memory devices such as dynamic random access memories (DRAMs), a plurality of semiconductor devices having the same construction are packaged on a single circuit substrate. Accordingly, there are demands to realize a method of packaging a plurality of semiconductor devices having the same construction with a high efficiency.

In order to increase the packaging density, the package structure becomes an important factor. Conventionally, small and thin packages such as the small outline package (SOP), the single in-line package (SIP) and the zigzag in-line package (ZIP) are known as package structures which enable high density packaging.

The SOP is a kind of surface package (surface mount). In other words, a SOP type semiconductor device is arranged on solder bumps which are formed on a circuit substrate, and the solder is thereafter melted to fix the semiconductor device.

On the other hand, the vertical type package such as the SIP and the ZIP has a structure such that leads are arranged in line along one side surface of the package. Accordingly, this vertical type package is mounted vertically on the circuit substrate. The packaging density is improved by this vertical mounting, and in addition, it is possible to improve the cooling efficiency of the package.

However, in the case of the SOP, there are problems in that a crack is easily formed in the package because it has a thin flat shape and the heat resistance of the package becomes large. In addition, because the package is surface mounted, there is also a problem in that the packaging area is large compared to that of the SIP, for example. In the case of the SIP and ZIP, there are problems in that it is difficult to make the package stand because the leads extend outwardly from one side surface thereof and the packaging (or mounting) process is troublesome to perform.

For this reason, a structure was proposed to help the vertical package sand on the circuit substrate. According to this proposed structure, projections are formed on the package, and holes corresponding to the projections are provided in the circuit substrate. The vertical package stands on the circuit substrate in a state where the projections fit into the corresponding holes of the circuit substrate. However, according to this proposed structure, there are problems in that the holes must be formed in the circuit substrate and the production efficiency becomes poor due to this additional step of forming the holes.

On the other hand, when the vertical package such as the SIP and the SIP are made thin, there are problems in that a crack is easily formed in the package and the heat resistance of the package becomes large.

SUMMARY OF THE INVENTION

Accordingly, it is a general object of the present invention to provide a novel and useful semiconductor device, a semiconductor device unit and a method of mounting semiconductor devices, in which the problems described above are eliminated.

Another and more specific object of the present invention is to provide a semiconductor device unit comprising a holder having a plurality of holding parts, and a plurality of semiconductor devices held by the holding parts of the holder, where each of the semiconductor devices have a generally parallelepiped shape with top and bottom surfaces and at least one side surface provided with leads which are exposed when the semiconductor device is held by the holding part of the holder. According to the semiconductor device unit of the present invention, it is possible to make the semiconductor devices stand vertically on a circuit substrate because the semiconductor device are held by the holder. The pitch with which the semiconductor devices may be arranged on the circuit substrate is improved, particularly when two or more semiconductor devices are held by one holding part of the holder. Therefore, the present invention can realize a high density packaging. In addition, the holder protects the relatively thin semiconductor devices the mechanical strength of which is not very large. Furthermore, the heat generated from the semiconductor device is transferred to the holder by thermal conduction and the heat resistance of the semiconductor device unit as a whole is improved compared to that of the semiconductor device itself.

Still another object of the present invention is to provide a method of mounting a plurality of semiconductor devices having leads provided on at least one side surface thereof onto a circuit substrate, comprising the steps of (a) holding the semiconductor devices in holding parts of a holder so that the leads are exposed, and (b) mounting the semiconductor devices hold by the holder onto the circuit substrate by connecting the exposed leads to the circuit substrate. According to the method of the present invention, it is possible to make the semiconductor devices stand vertically on a circuit substrate because the semiconductor devices are held by the holder. The pitch with which the semiconductor devices may be arranged on the circuit substrate is improved, particularly when two or more semiconductor devices are held by one holding part of the holder. Therefore, the present invention can realize a high density packaging. In addition, the holder protects the relatively thin semiconductor devices the mechanical strength of which is not very large. Furthermore, the heat generated from the semiconductor device is transferred to the holder by thermal conduction and the heat resistance of the semiconductor device unit as a whole is improved compared to that of the semiconductor device itself.

A further object of the present invention is to provide a semiconductor device adapted to be mounted on a circuit substrate in an approximate vertical position, comprising a semiconductor chip, a stage having a first surface and a second surface opposite to the first surface, where the semiconductor chip is mounted on the first surface, a resin package encapsulating the semiconductor chip, where the resin package has upper and lower surfaces and side surfaces, a plurality of leads respectively having one end electrically connected to the semiconductor chip and another end extending downwardly from the lower surface of the resin package, and an upper extension, provided on the stage, extending upwardly from the upper surface of the resin package. According to the semiconductor device of the present invention, the heat generated from the semiconductor chip is conducted via the stage and is radiated from the upper extension that is exposed from the upper surface of the resin package. As a result, it is possible to efficiently radiate the heat generated from the semiconductor chip.

Another object of the present invention is to provide a semiconductor device unit comprising a holder having an upper portion with an opening, and a plurality of semiconductor devices arranged in parallel at approximately vertical positions within the holder, where each of the semiconductor devices comprise a semiconductor chip, a stage having a first surface and a second surface opposite to the first surface, the semiconductor chip being mounted on the first surface, a resin package encapsulating the semiconductor chip, the resin package having upper and lower surfaces and side surfaces, a plurality of leads respectively having one end electrically connected to the semiconductor chip and another end extending downwardly from the lower surface of the resin package, and an upper extension, provided on the stage, extending upwardly from the upper surface of the resin package. According to the semiconductor device unit of the present invention, the plurality of semiconductor devices can be supported by the holder in the parallel arrangement, and the heat generated from the semiconductor chips and conducted via the resin packages is radiated via the holder which accommodates the semiconductor devices. Since the size of the holder is larger than that of the individual semiconductor devices, the contact area of the holder with respect to the surrounding air is large, thereby achieving an efficient heat radiation. In addition, the heat radiation is also possible via the opening of the holder.

Still another object of the present invention is to provide a semiconductor device unit comprising at least one positioning shaft, and a plurality of semiconductor devices arranged in parallel at approximately vertical positions, where each of the semiconductor devices comprise a semiconductor chip, a stage having a first surface and a second surface opposite to the first surface, the semiconductor chip being mounted on the first surface, a resin package encapsulating the semiconductor chip, the resin package having upper and lower surfaces and side surfaces, a plurality of leads respectively having one end electrically connected to the semiconductor chip and another end extending downwardly from the lower surface of the resin package, an upper extension, provided on the stage, extending upwardly from the upper surface of the resin package, a pair of vertical portions provided vertically on both sides of the stage, a positioning groove provided between the pair of vertical portions, and a positioning hole provided in each of the pair of vertical portions, where the positioning shaft penetrates the positioning hole in each of the semiconductor devices to collectively position the semiconductor devices. According to the semiconductor device unit of the present invention, it is possible to easily form the semiconductor device unit from the semiconductor devices. In addition, it is possible to reduce the cost of the semiconductor device unit because only the positioning shaft is required to position the semiconductor devices.

Other objects and further features of the present invention will be apparent from the following detailed description when read in conjunction with the accompanying drawings.

BRIEF DESCRIPTION OF THE DRAWINGS

FIGS. 4A through 4D respectively are perspective views for explaining the soldering of leads of the semiconductor devices on a circuit substrate shown in FIG. 1;

FIG. 5 is a perspective view showing a second embodiment of the semiconductor device unit according to the present invention;

DESCRIPTION OF THE PREFERRED EMBODIMENTS

Figure 1:
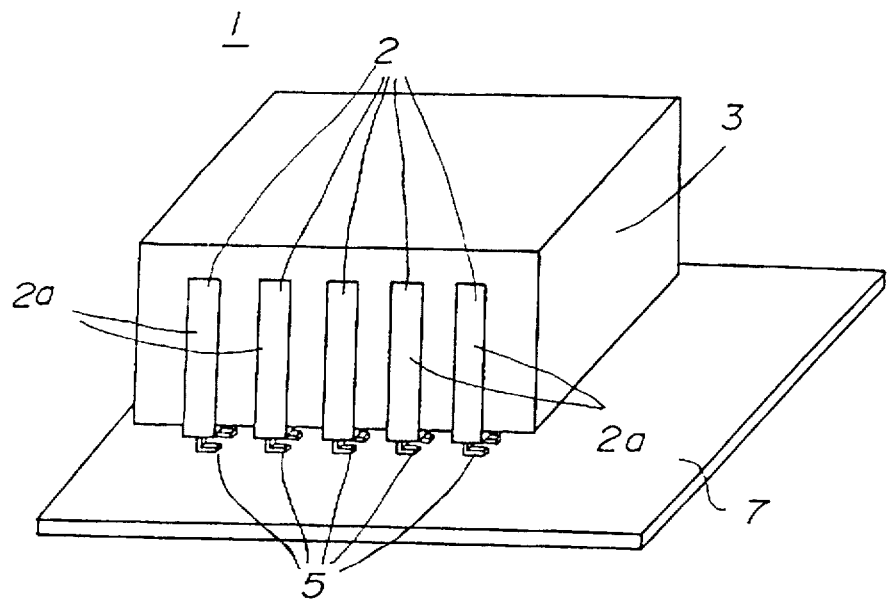
FIG. 1 is a perspective view showing a first embodiment of a semiconductor device unit according to the present invention.

A description will be given of a first embodiment of a semiconductor device unit according to the present invention. FIG. 1 shows the first embodiment, and in FIG. 1, a semiconductor unit 1 includes semiconductor devices 2 and a holder 3 which holds the semiconductor devices 2.

For example, the semiconductor device 2 is a memory device such as the DRAM, and a plurality of semiconductor devices having the same construction are packaged on a single circuit substrate 7. Each semiconductor device 2 has the vertical package structure showing on an enlarged scale in FIG. 2. In the semiconductor device 2 shown in FIG. 2, a plurality of leads 5 extend outwardly from one side surface of a package 4 which is made of a resin. A semiconductor element (not shown) such as a memory device is encapsulated within the package 4. Because the package 4 is relatively thin, the mechanical strength of the semiconductor device 2 itself is poor and its heat resistance is large. On the other hand, as shown in FIG. 2, the leads 5 are bent in an L-shape at the tip extension thereof.

Figure 2:
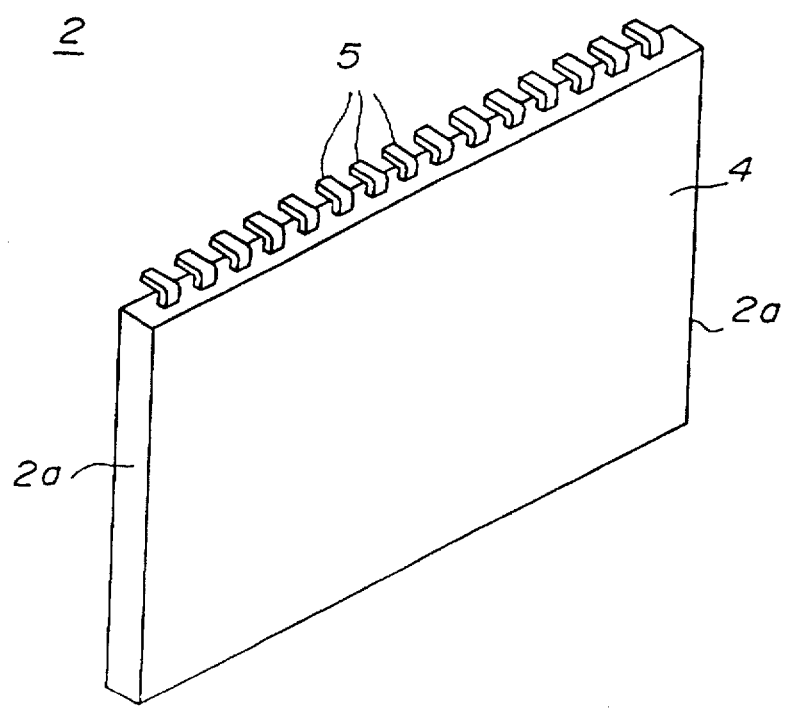
FIG. 2 is a perspective view showing a semiconductor device shown in FIG. 1.

The semiconductor device 2 having the vertical package structure shown in FIG. 2 does not easily stand by itself on the circuit substrate 7. Even if it were possible to make the semiconductor device 2 stand by itself on the circuit substrate 7, the semiconductor device 2 would be too unstable to allow satisfactory soldering of the leads 5 onto the circuit substrate 7.

According to the present invention, the semiconductor devices 2 which by themselves cannot stably stand on the circuit substrate 7 are held by the holder 3 so that the semiconductor devices 2 stand stably on the circuit substrate 7 when soldering the leads 5 onto the circuit substrate 7.

Figure 3:
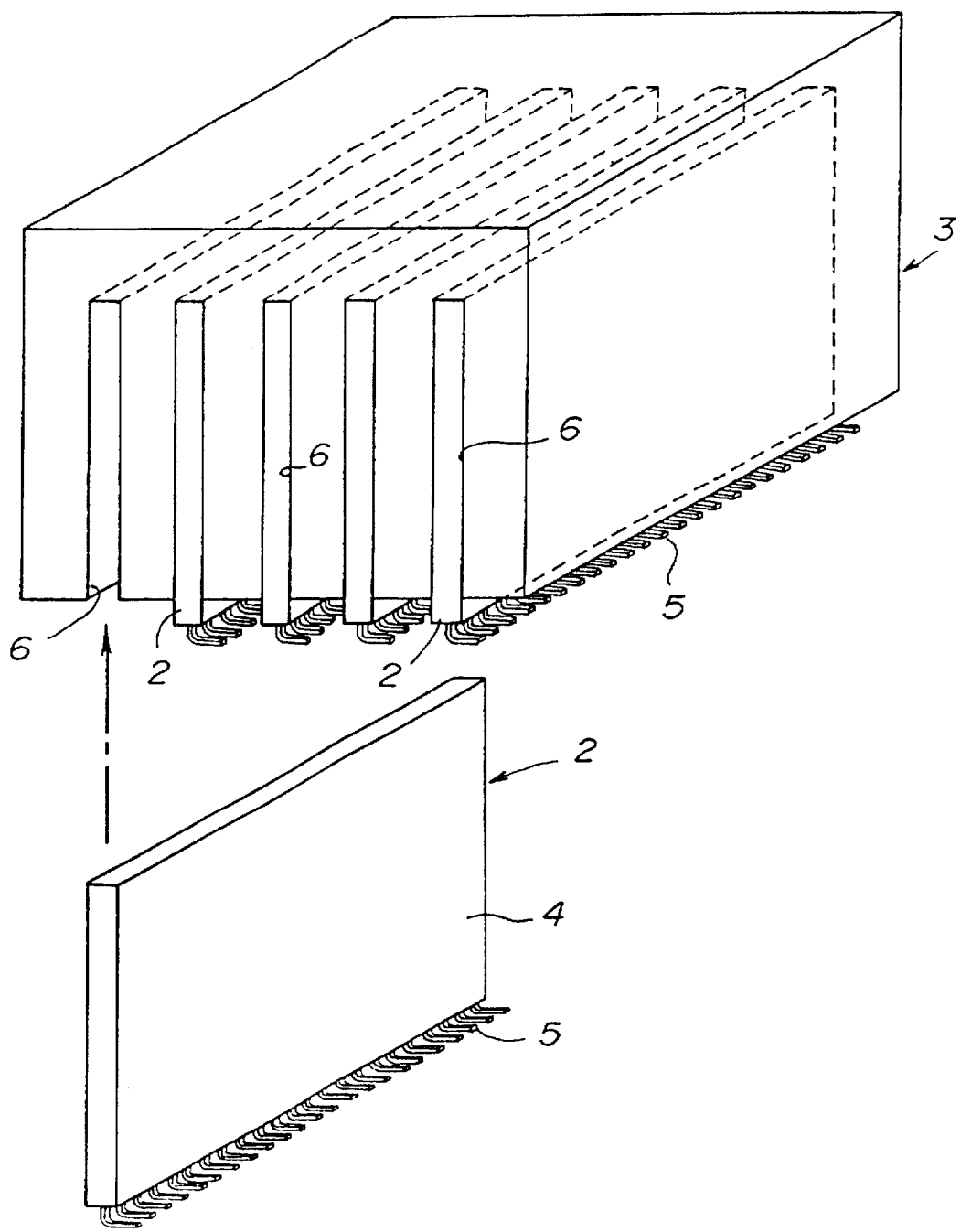
FIG. 3 is a perspective view for explaining holding of the semiconductor devices in a holder shown in FIG. 1.

For example, the holder 3 is molded from a resin and has a box shape as shown in FIG. 3. In this embodiment, the holder 3 has five holding parts 6 for receiving the semiconductor devices 2. Each holding part 6 opens at the front and bottom surfaces of the holder 3. The holding parts 6 may be formed at the same time as molding the holder 3 by known means.

When assembling the semiconductor device unit 1, each semiconductor device 2 is inserted into the corresponding holding part 6 of the holder 3. The semiconductor device unit 1 is assembled by this simple operation. Hence, the packaging process will not become complex and will not greatly increase the number of production steps by this process of assembling the semiconductor device unit 1.

Next, a description will be given of the method of soldering the leads 5 of the semiconductor devices 2 onto the circuit substrate 7, by referring to FIGS. 4A through 4D.

First, in FIG. 4A, a mask 100 including a plurality of windows 101 is placed on the circuit substrate 7 so that each window 101 matches a corresponding region 105 where the solder is to be applied.

Figure 4B:
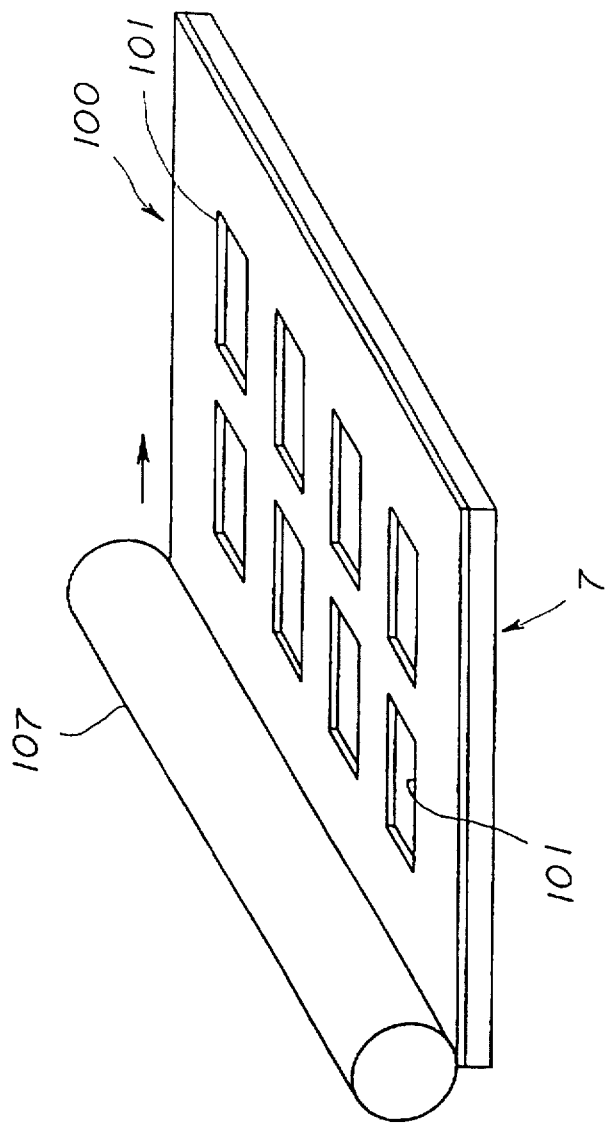

Second, in FIG. 4B, a roll of solder 107 rolls in a direction of an arrow over the mask 100 to form the solder 107 on the regions 105 of the circuit substrate 7 via the windows 101.

Figure 4C:
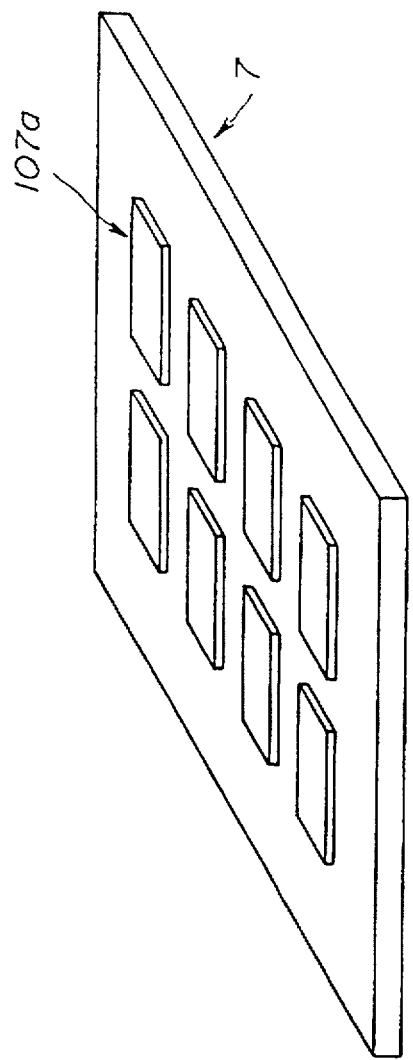

Third, in FIG. 4C, the mask 100 is removed, and as a result, solder parts 107a are formed in the regions 105 of the circuit substrate 7.

Fourth, in FIG. 4D, each semiconductor device 2 (only one shown for the sake of convenience) is placed on the circuit substrate 7 so that the leads 5 rest on the corresponding solder parts 107a. Then, a reflow process is carried out to connect the leads 5 onto the circuit substrate 7 by the melted solder parts 107a.

FIG. 1 shows the semiconductor device unit 1 in the assembled state, and the semiconductor devices 2 are held within the holder 3. The leads 5 extend downwardly from each of the semiconductor devices 2 within the holder 3. Accordingly, although each semiconductor device 2 by itself cannot stand stably on the circuit substrate 7, the semiconductor devices 2 within the holder 2 cooperate and stand stably on the circuit substrate 7. There is no need to provide holds in the circuit substrate 7 as in the case of the proposed structure described above, and it is possible to improve the packaging efficiency. In addition, because the semiconductor devices 2 are held by the holder 3, it is possible to reduce the pitch with which the semiconductor devices 2 are arranged on the circuit substrate 7 and to realize a high packaging density.

The package 4 is relatively thin and the semiconductor device 2 by itself does not have a satisfactory mechanical strength and has a large heat resistance. However, when the semiconductor devices 2 are held by the holder 3, the package 4 of each semiconductor device 2 is in contiguous contact with walls of the holder 3 defining the corresponding holding part 6. For this reason, the holder 3 also functions as a support member for improving the mechanical strength of each semiconductor device 2, and cracks will not easily be formed in the package 4 although the package 4 itself is relatively thin. Furthermore, the heat generated from each semiconductor device 2 is transferred to the holder 3 by thermal conduction. As a result, the heat resistance of the semiconductor device unit 1 as a whole decreases compared to that of the semiconductor device 2 itself, and the heat is efficiently radiated. Therefore, it is possible to reduce the undesirable effects of heat on each of the semiconductor devices 2.

FIG. 5 shows a second embodiment of the semiconductor device unit according to the present invention. A semiconductor device unit 11 shown in FIG. 5 includes a holder 13 and a plurality of semiconductor devices 2 held in holding parts 16 of the holder 13. In this embodiment, the holding part 16 opens only at the bottom surface of the holder 13. Hence, compared to the first embodiment shown in FIG. 1 in which a side surface 2a of each semiconductor device 2 held by the holder 3 is exposed to the outside, the mechanical strength and the heat resistance of the semiconductor device 2 are improved in this second embodiment.

In other words, the holding part 16 of the holder 13 is a rectangular well which opens only at the bottom surface of the holder 13. For this reason, the semiconductor device 2 is buried in the holder 13 when the semiconductor device 2 is held by the holding part 16, and all of the outer surfaces of the semiconductor device 2 excluding the surface provided with the leads 5 make contiguous contact with the walls defining the holding part 16. Therefore, the mechanical strength of the semiconductor device 2 is improved compared to that of the first embodiment, and it is also possible to improve the cooling efficiency of the semiconductor device 2.

Figure 6:
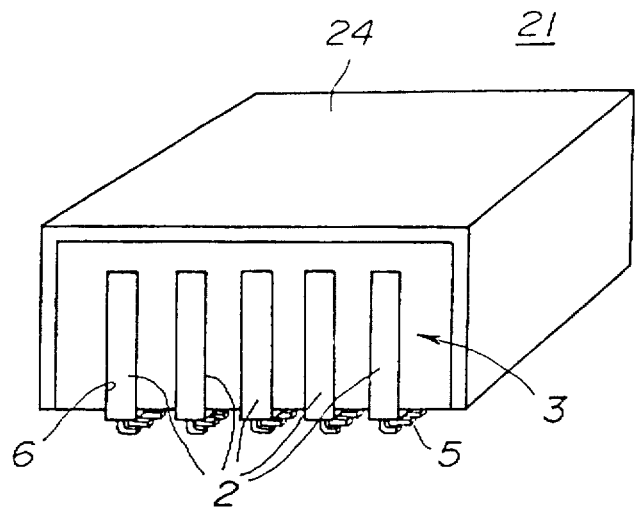
FIG. 6 is a perspective view showing a third embodiment of the semiconductor device unit according to the present invention.

FIG. 6 shows a third embodiment of the semiconductor device unit according to the present invention. In FIG. 6, those parts which are the same as those corresponding parts in FIGS. 1 through 3 are designated by the same reference numerals, and a description thereof will be omitted.

A semiconductor device unit 21 shown in FIG. 6 includes a cooling fin 24 which is provided around selected outer surfaces of the holder 3. For example, the cooling fin 24 is made of a metal, and improves the cooling efficiency of the semiconductor device 2.

Figure 7:
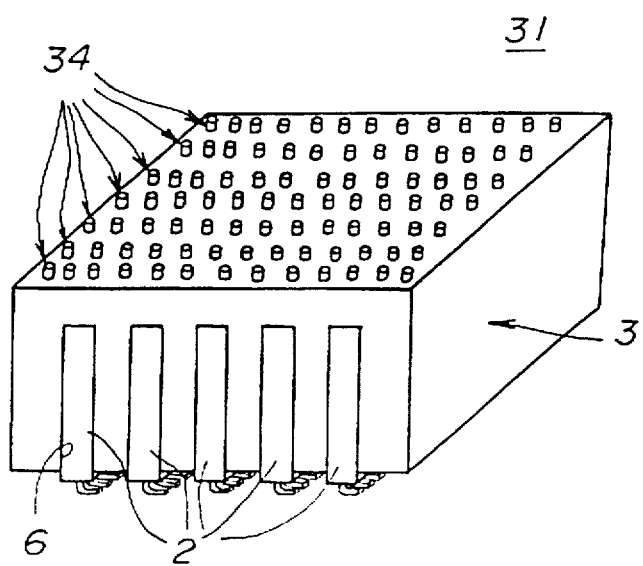
FIG. 7 is a perspective view showing a fourth embodiment of the semiconductor device unit according to the present invention.

FIG. 7 shows a fourth embodiment of the semiconductor device unit according to the present invention. In FIG. 7, those parts which are the same as those corresponding parts in FIGS. 1 through 3 are designated by the same reference numerals, and a description thereof will be omitted.

A semiconductor device unit 31 shown in FIG. 7 includes cooling fins 34 which are provided on the top surface of the holder 3. The cooling fins 34 improve the cooling efficiency of the semiconductor device 2.

In FIGS. 6 and 7, the holder 3 may be made of a metal or a plastic, and the cooling fins 24 and 34 may be made of a metal of a plastic. An arbitrary combination of materials may be used for the holder 3 and the cooling fins 24 and 34, but if the same material is used for the two, the cooling fins 24 and 34 may be integrally formed on the holder 3.

In the embodiments described above, the semiconductor device 2 has the L-shaped leads 5. However, it is possible to use other types of semiconductor devices such as the semiconductor devices shown in FIGS. 8 and 9. The semiconductor devices shown in FIGS. 8 and 9 may also be used in fifth through eighth embodiments which will be described later.

Figure 8:
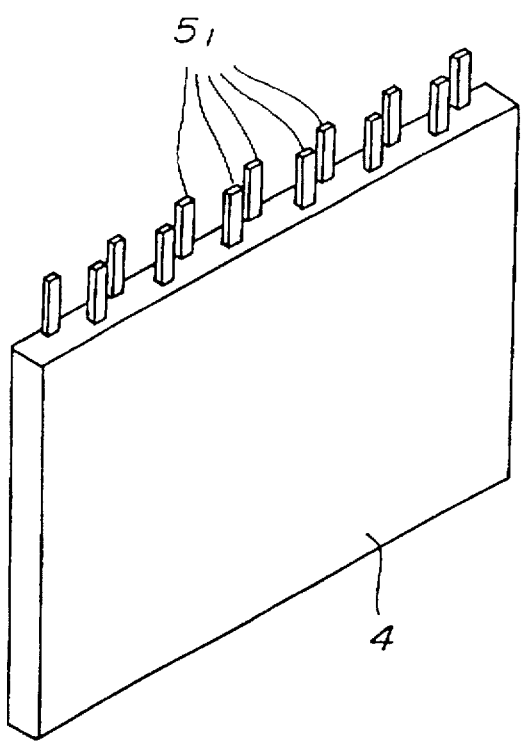
FIG. 8 is a perspective view showing a semiconductor device to which the present invention may be applied.

A semiconductor device $2_1$ shown in FIG. 8 has leads $5_1$ which are arranged in a zigzag manner, so that the density of the leads $5_1$ may be improved.

Figure 9:
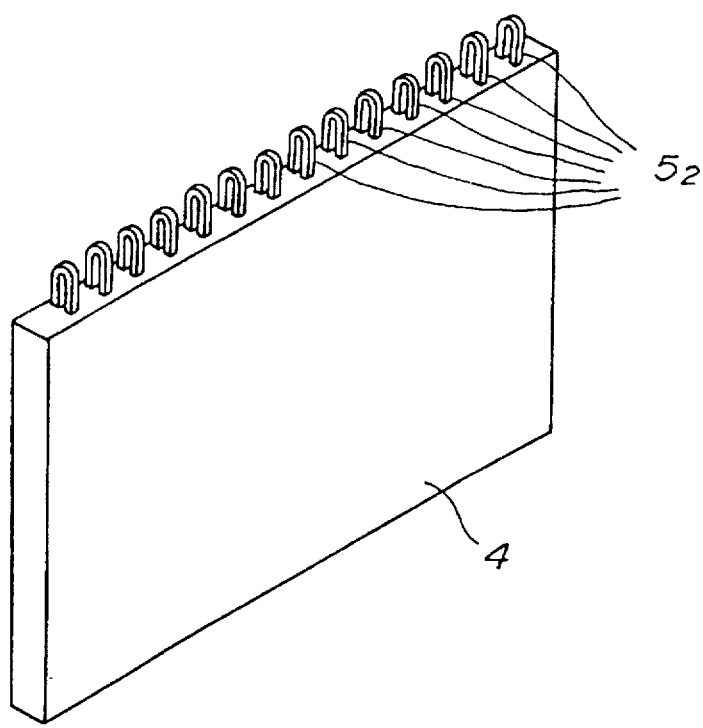
FIG. 9 is a perspective view showing another semiconductor device to which the present invention may be applied.

A semiconductor device $2_2$ shown in FIG. 9 has loop shaped leads $5_2$. The shape of the leads $5_2$ would make it almost impossible for the semiconductor device $2_2$ to stand by itself on the circuit substrate 7, but the present invention would enable a plurality of such semiconductor devices $2_2$ to stably stand on the circuit substrate 7 by the use of the holder.

Figure 10:
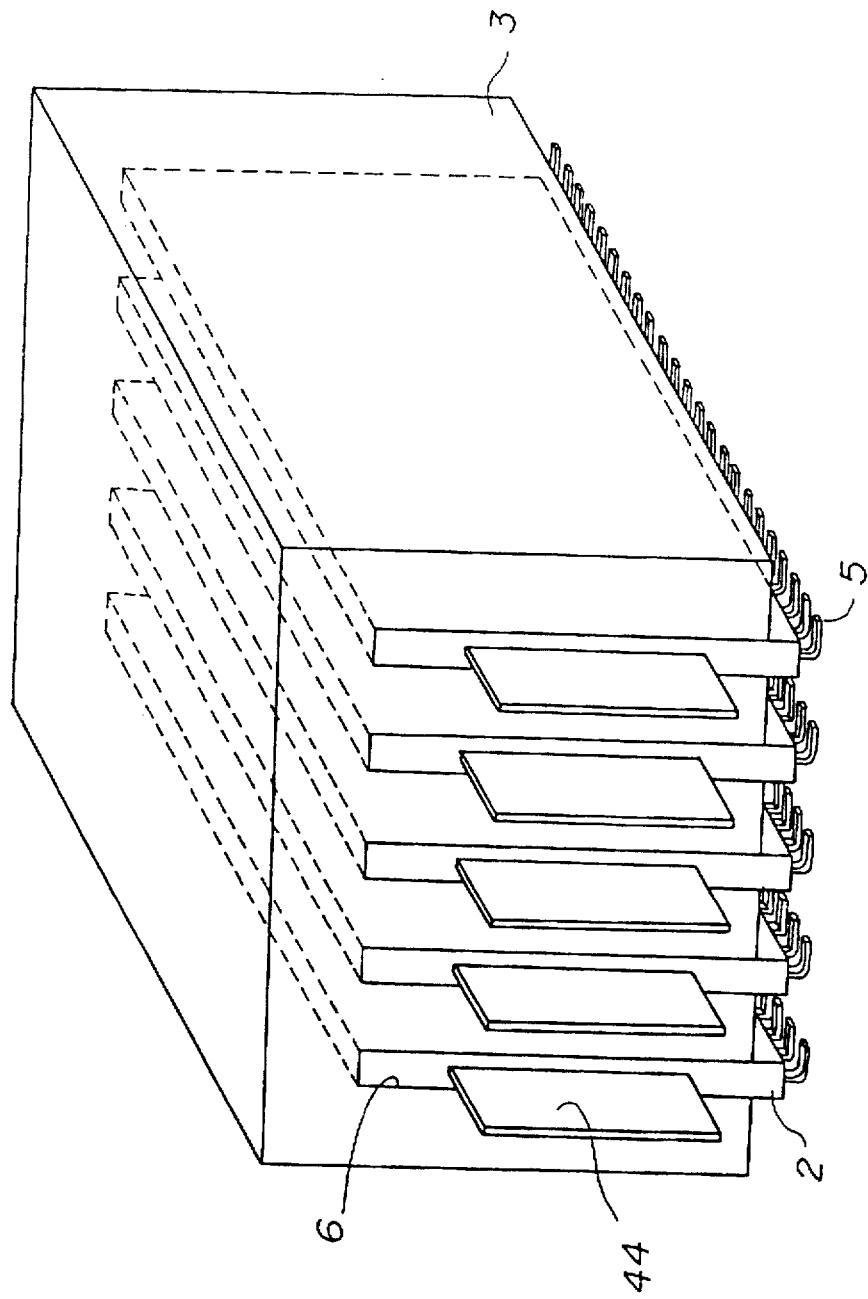
FIG. 10 is a perspective view showing a fifth embodiment of the semiconductor device unit according to the present invention.

FIG. 10 shows a fifth embodiment of the semiconductor device unit according to the present invention. In FIG. 10, those parts which are the same as those corresponding parts in FIGS. 1 through 3 are designated by the same reference numerals, and a description thereof will be omitted.

According to a semiconductor device unit 41 shown in FIG. 10, a cooling fin 44 is provided on the left part of each semiconductor device 2 which is held by the holder 3, and each cooling fin 44 projects from the holder 3. As a result, the cooling effect of the semiconductor device 2 is improved.

Figure 11:
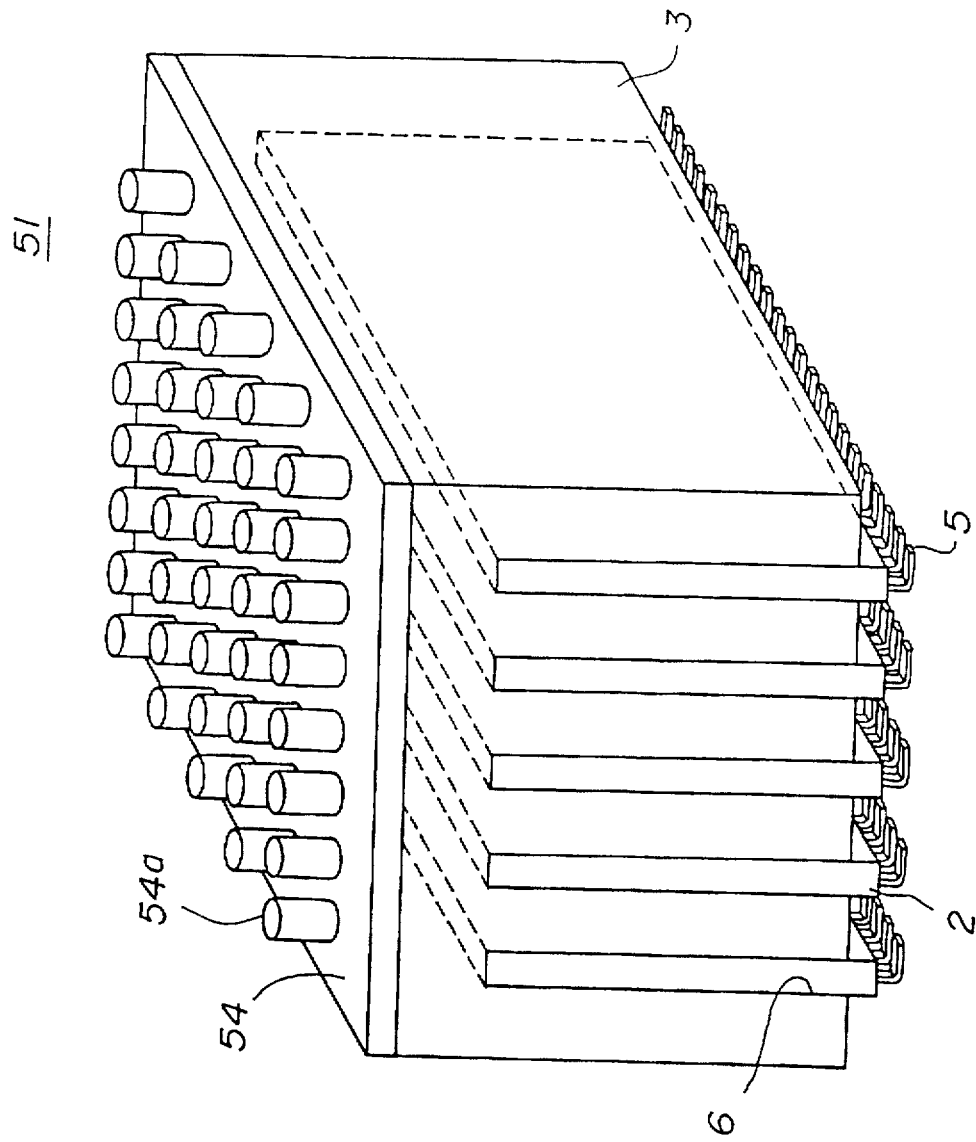
FIG. 11 is a perspective view showing a sixth embodiment of the semiconductor device unit according to the present invention.

FIG. 11 shows a sixth embodiment of the semiconductor device unit according to the present invention. In FIG. 11, those parts which are the same as those corresponding parts in FIGS. 1 through 3 are designated by the same reference numerals, and a description thereof will be omitted.

According to a semiconductor device unit 51 shown in FIG. 11, a cooling part 54 including a plurality of cooling pins 54a is provided on the top surface of the holder 3. The holder 3 may be made of a metal or a plastic, and the cooling part 54 may be made of a metal or a plastic. An arbitrary combination of materials may be used for the holder 3 and the cooling part 54, but if the same material is used for the two, the cooling part 54 may be integrally formed on the holder 3.

Figure 12:
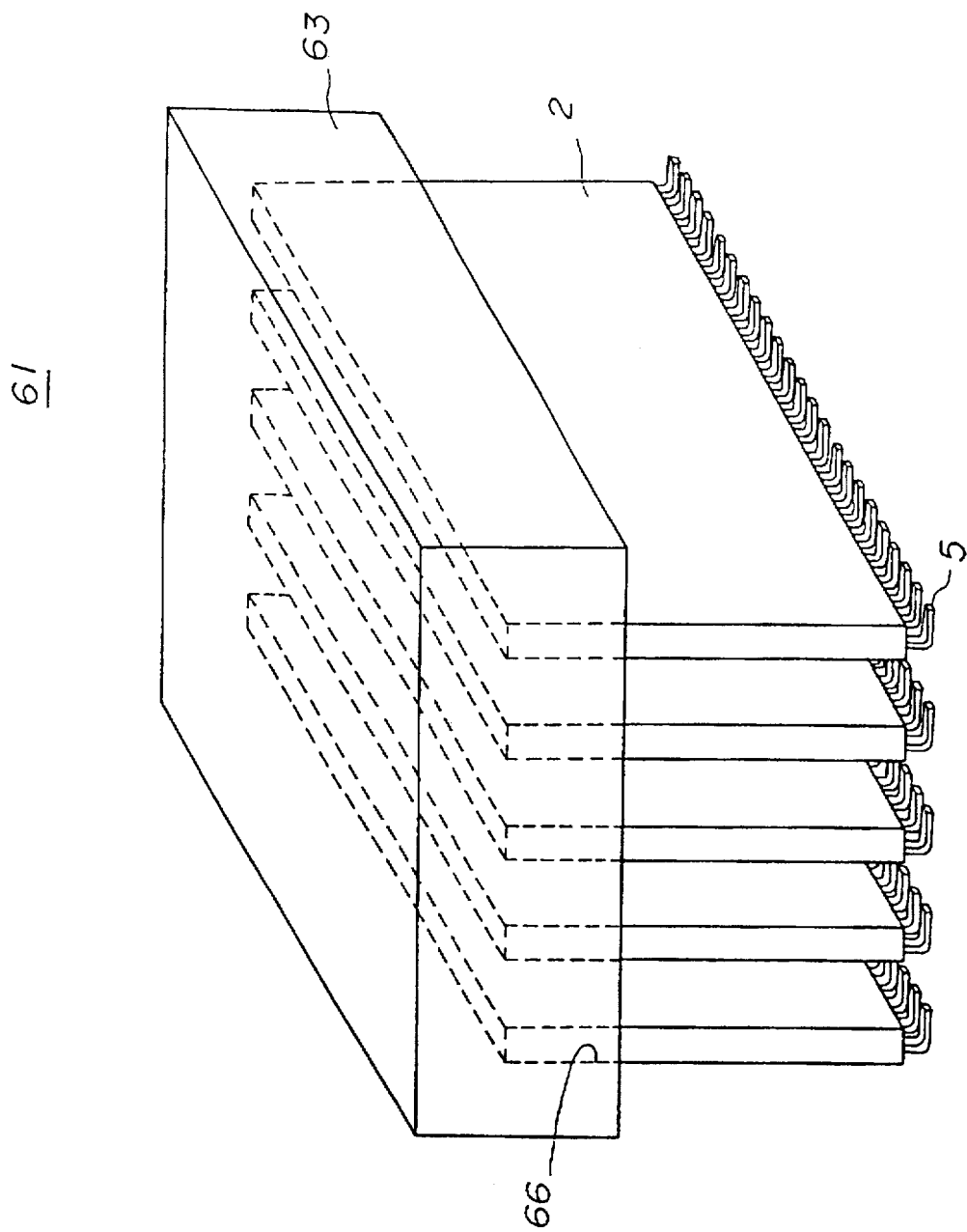
FIG. 12 is a perspective view showing a seventh embodiment of the semiconductor device unit according to the present invention.

FIG. 12 shows a seventh embodiment of the semiconductor device unit according to the present invention. In FIG. 12, those parts which are the same as those corresponding parts in FIGS. 1 through 3 are designated by the same reference numerals, and a description thereof will be omitted.

According to a semiconductor device unit 61 shown in FIG. 12, only the top part of each semiconductor device 2 is fit into a holder 63. In other words, a holding part 66 of the holder 63 holds only the top part of the semiconductor device 2. Walls of the holder 63 defining the holding part 66 make contiguous contact with the top part of the semiconductor device 2, and thus, the holder 63 can make the semiconductor devices 2 stand stably on the circuit substrate 7 when soldering the leads 5 onto the circuit substrate 7.

Figure 13:
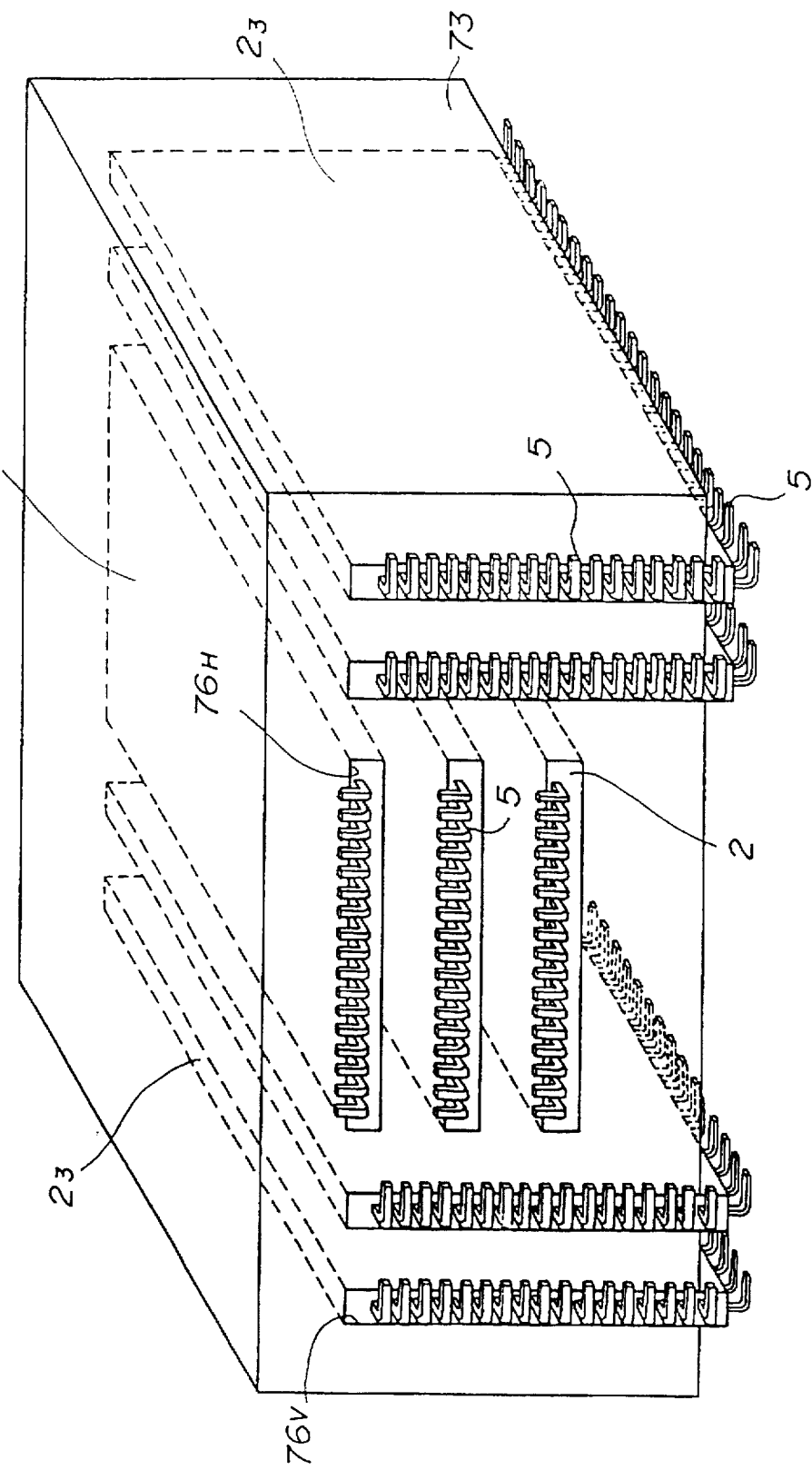
FIG. 13 is a perspective view showing an eight embodiment of the semiconductor device unit according to the present invention.

FIG. 13 shows an eighth embodiment of the semiconductor device unit according to the present invention. In FIG. 13, those parts which are the same as those corresponding parts in FIGS. 1 through 3 are designated by the same reference numerals, and a description thereof will be omitted.

According to a semiconductor device unit 71 shown in FIG. 13, a holder 72 has holding parts $76_V$ for vertically holding semiconductor devices $2_3$, and holding parts $76_H$ for horizontally holding the semiconductor devices 2. Each semiconductor device $2_3$ has the leads 5 provided on two adjacent side surfaces thereof. When the semiconductor device $2_3$ is held by the holding part $76_V$ of the holder 73, the leads 5 of the semiconductor device $2_3$ are exposed at the front and bottom surfaces of the holder 73. On the other hand, when the semiconductor device 2 is held by the holding part $76_H$ of the holder 73, the leads 5 of the semiconductor device 2 are exposed at the front surface of the holder 73. Therefore, according to this embodiment, both the leads 5 exposed at the front surface of the holder 73 and the leads 5 exposed at the bottom surface of the holder 73 can be soldered onto the corresponding circuit substrate 7. This embodiment is thus advantageous in that the semiconductor devices $2_3$ having a large number of leads 5 can be packaged on the circuit substrates 7. In addition, different kinds of semiconductor devices can be positively supported by the holder 73 when making the packaging process.

Figure 14:
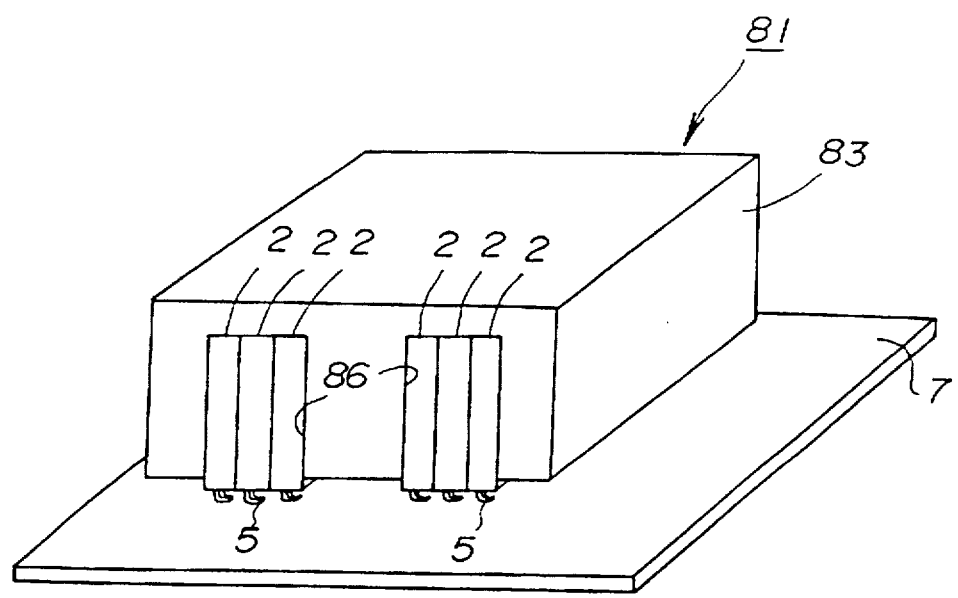
FIG. 14 is a perspective view showing a ninth embodiment of the semiconductor device unit according to the present invention.

FIG. 14 shows a ninth embodiment of the semiconductor device unit according to the present invention. In FIG. 14, those parts which are the same as those corresponding parts in FIGS. 1 through 3 are designated by the same reference numerals, and a description thereof will be omitted.

According to a semiconductor device unit 81 shown in FIG. 14, a holder 83 has two holding parts 86. Each holding part 86 holds three semiconductor devices 2 in contiguous contact therewith. As a result, the pitch with which the semiconductor devices 2 may be arranged on the circuit substrate 7 may further be improved. Of course, the number of semiconductor device 2 held by each holding part 86 of the holder 83 is not limited to three, and an arbitrary number of semiconductor devices 2 greater than one may be held by each holding part 86.

In each of the embodiments described above, it is desirable that no air exists between the surfaces of the semiconductor device and the walls of the holder holding at least a part of the semiconductor device. I order to ensure contiguous contact between the contacting surfaces of the semiconductor device and the walls defining the holding part of the holder, it is possible to coat a lubricant such as grease on the surface of the semiconductor device and/or the walls defining the holding part of the holder.

In addition, the shape of the holder is not limited to that of the described embodiments. In other words, the holder in the described embodiments has a generally parallelepiped shape in conformance with the generally parallelepiped shape of the semiconductor device, but it is of course possible to employ other shapes for the holder.

Moreover, in each of the embodiments excluding the second embodiment, the side surface of the semiconductor device exposed at the front of the holder does not necessarily have to coincide with the front surface of the holder. In other words, the end part of the semiconductor device may project slightly from the front surface of the holder.

Figure 15:
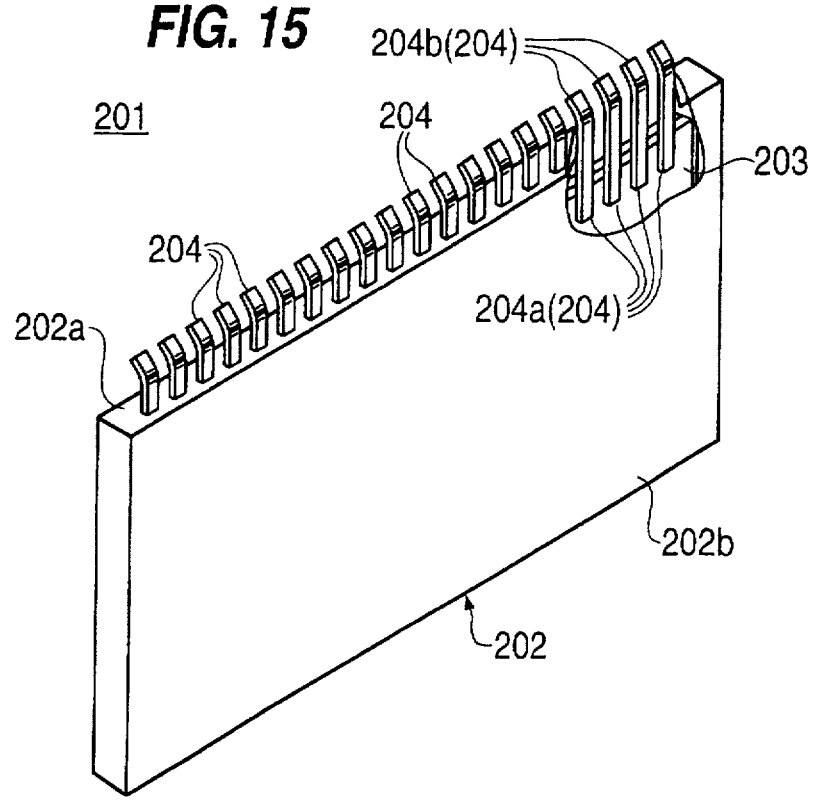
FIG. 15 is a perspective view showing a conceivable semiconductor device.

FIG. 15 shows a conceivable semiconductor device. A conceivable semiconductor device 201 shown in FIG. 15 includes a semiconductor chip 203, and a resin package 202 which encapsulates the semiconductor chip 203. The semiconductor chip 203 is buried inside the resin package 202 in a state where the semiconductor chip 203 is to be mounted on a stage. Inner lead portions 204a of leads 204 connect to the semiconductor chip 203, and outer lead portions 204b of the leads extend outwardly from one side surface of the resin package 202. A predetermined tip end part of each outer lead portion 204b is bent, so as to facilitate mounting of the semiconductor device 201 onto a circuit substrate 206 shown in FIGS. 16 and 17 which will be described later.

When mounting the semiconductor device 201 onto the circuit substrate 206, the resin package 202 is positioned vertically with respect to the circuit substrate 206 so that the outer lead portions 204b connect to the circuit substrate 206. By mounting the resin package 202 in the vertical position on the circuit substrate 206, the required mounting space of the semiconductor device 201 on the circuit substrate 206 is only the area of a side surface 202a from which the outer lead portions 204b extend outwardly from the resin package 202.

Accordingly, compared to the semiconductor devices such as the quad flat package (QFP) which is mounted on the circuit substrate with the large surface of the resin package confronting the circuit substrate, the semiconductor device 201 can reduce the mounting space required therefor, and the mounting density of the semiconductor device 201 is improved.

Figure 16:
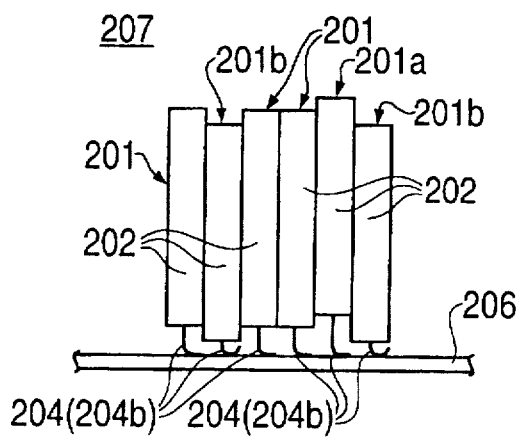
FIG. 16 is a side view showing a conceivable semiconductor device unit.
Figure 17:
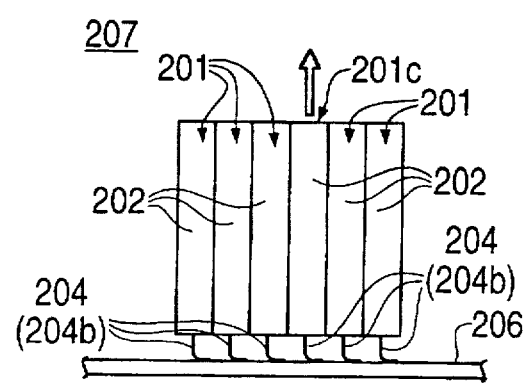
FIG. 17 is a side view showing another conceivable semiconductor device unit.

A plurality of semiconductor devices 201 in the vertical position may be arranged in parallel to form a semiconductor device unit, as shown in FIGS. 16 and 17. In FIGS. 16 and 17, a conceivable semiconductor device unit 207 is made up of 6 vertical type semiconductor devices 201 which are stacked in the horizontal direction. The semiconductor device unit 207 is mounted on the circuit substrate 206 in a state where the semiconductor devices 201 are in contiguous contact with each other.

However, according to the semiconductor device 201 shown in FIG. 15, the semiconductor chip 203 and the stage are entirely buried within the resin package 202. For this reason, the heat generated from the semiconductor chip 203 is radiated to the outside via the resin package 202. However, the thermal conductivity of the resin package 202 is low, and it may be difficult in the case of the semiconductor device 201 to obtain a satisfactory heat radiation efficiency or cooling efficiency.

On the other hand, when a plurality of semiconductor devices 201 are individually mounted on the circuit substrate 206 in the form of the semiconductor device unit 207 as shown in FIG. 16, the heights of the semiconductor devices 201 with respect to the circuit substrate 206 after the mounting may be different.

When the semiconductor device unit 207 having the semiconductor devices 201 with the different heights is to be accommodated within a compact electronic equipment housing, a semiconductor device 201a shown in FIG. 16 which projects by an amount exceeding a designed height may prevent the semiconductor device unit 207 from being accommodated within the electronic equipment housing.

Furthermore, when a semiconductor device 201b is lower than the designed height, the outer lead portions 204b of the leads 204 may be collapsed. In such a case, a satisfactory electric connection may not be obtained between the semiconductor device 201b and the circuit substrate 206.

In addition, after testing the semiconductor device unit 207, it may turn out that a defective semiconductor device 201c exists as shown in FIG. 17. In this case, it is necessary to remove the defective semiconductor device 201c from the semiconductor device unit 207 and change this defective semiconductor device 201c with a new semiconductor device 201.

But since the semiconductor devices 201 are mounted on the circuit substrate 206 in contiguous contact with each other in order to improve the mounting density, it is difficult to extract the defective semiconductor device 201c. As a result, it may be difficult to achieve a satisfactory maintenance of the semiconductor device unit 207.

Moreover, the semiconductor devices 201 which are arranged in contiguous contact with each other generate heat. Hence, the contiguous parallel arrangement of the semiconductor devices 201 in the semiconductor device unit 207 may prevent efficient heat radiation to the outside.

Next, a description will be given of embodiments of the semiconductor device and semiconductor device units according to the present invention, in which the possible inconveniences of the conceivable semiconductor device and semiconductor device unit described above are eliminated, and particularly the heat radiation efficiency or cooling efficiency of the semiconductor device is improved.

Figure 18:
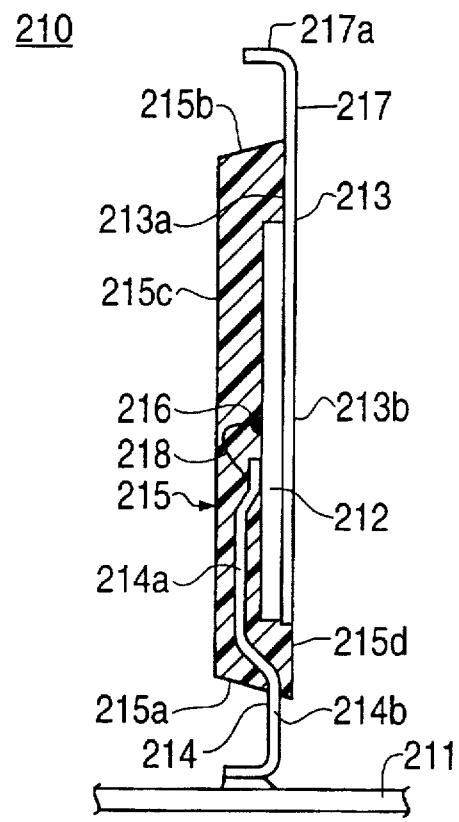
FIG. 18 is a cross sectional view showing a first embodiment of a semiconductor device according to the present invention.

FIG. 18 shows a first embodiment of the semiconductor device according to the present invention. A vertical type semiconductor device 210 shown in FIG. 18 is designed to be mounted vertically on a circuit substrate 211. The semiconductor device 210 includes a semiconductor chip 212, a stage 213, leads 214 and a resin package 215.

The semiconductor chip 212 generates heat when operated. The semiconductor chip 212 is encapsulated within the resin package 215 in a state where the semiconductor chip 212 is mounted on a predetermined surface of the stage 213. Electrode pads 216 are formed at approximate center part of the semiconductor chip 212, and these electrode pads 216 are connected to the leads 214 via wires 218.

The leads 214 are made of a lead material such as 42 alloy (FeNi alloy). Each lead 214 includes an inner lead portion 214a which is buried within the resin package 215, and an outer lead portion 214b which extends to the outside of the resin package 215. The wire 218 is wire-bonded on the end of the inner lead portion 214a. The inner lead portions 214a extend to positions confronting the semiconductor chip 212, and forms the so-called lead-on-chip structure.

The outer lead portion 214b of each lead 214 is bent in an approximate L-shape. Because the tip ends of the outer lead portions 214b are bent in the approximate L-shape, it is possible to improve the stability of the semiconductor device 210 when it stands vertically on the circuit substrate 211. Hence, when arranging a plurality of such semiconductor devices 210 as will be described later, it is possible to facilitate the operation of arranging the semiconductor devices 210 in parallel.

The resin package 215 is formed by a transfer molding using an epoxy resin or the like, for example, and encapsulates inside the semiconductor chip 212, the stage 213 and the inner lead portions 214a of the leads 214. The resin package 215 protects the semiconductor chip 212 and the like from the outside. In addition, the leads 214 extend downwardly from a lower surface 215a of the resin package 215 confronting the circuit substrate 211. The tip ends of the leads 214, that is, the outer lead portions 214b are bent as described above to improve the mounting with respect to the circuit substrate 211.

The lower surface 215a of the resin package 215 has an area smaller than those of side surfaces 215c and 215d of the resin package 215. Hence, when the semiconductor device 210 stands vertically on the circuit substrate 211, the mounting space of the semiconductor device 210 required on the circuit substrate 211 is only a small area approximately the same as the area of the lower surface 215a. For this reason, it is possible to improve the mounting efficiency.

A description will now be given of the stage 213.

The stage 213 is made of a metal such as a copper alloy having a good heat conductance. An upper portion of the stage 213 extends upwardly from an upper surface 215b of the resin package 215 and forms an upper extension 217. A predetermined upper end of this upper extension 217 is bent to form a bent portion 217a. The stage 213 has an exposed surface 213b opposite to a mounting surface 213a on which the semiconductor chip 212 is mounted, and this exposed surface 213b is exposed to the outside of the resin package 215.

As described above, the semiconductor chip 212 generates heat when operated. The heat generated from the semiconductor chip 212 conducts via first and second heat conduction paths. The first heat conduction path is formed by the stage 213 on which the semiconductor chip 212 is mounted, while the second heat conduction path is formed by the resin package 215. Since the stage 213 is made of the metal having a good heat conductance, most of the heat generated from the semiconductor chip 212 conducts via the first heat conduction path, that is, the stage 213.

The heat radiation takes place at the exposed surface 213b of the stage 213 because the exposed surface 213b is exposed to the outside of the resin package 215. In addition, since the upper extension 217 of the stage 213 extends upwardly from the upper surface 215b of the resin package 215, the upper extension 217 functions as a radiator fin. Hence, the heat radiation also takes place at the upper extension 217. As a result, the heat generated from the semiconductor chip 212 is radiated from the exposed surface 213b ad the upper extension 217 as the heat conducts via the stage 213, and the semiconductor chip 212 can be cooled efficiently.

The upper extension 217 extends from the upper surface 215b of the resin package 215, that is, from a surface of the resin package 215 different from the surface where the leads 214 are arranged. Thus, the provision of the upper extension 217 does not affect the pitch of the leads 214, and the pitch of the leads 214 can be maintained narrow.

Figure 19:
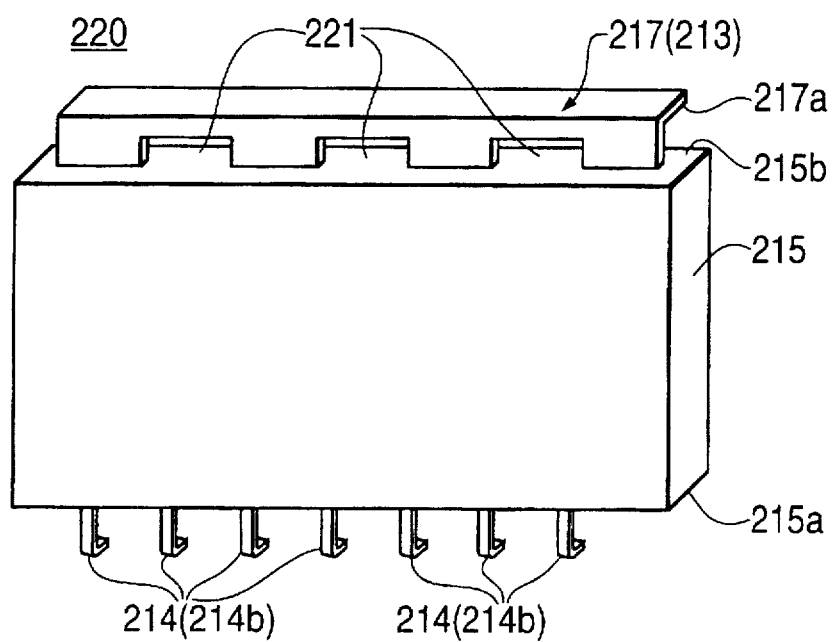
FIG. 19 is a perspective view showing a second embodiment of the semiconductor device according to the present invention.

FIG. 19 shows a second embodiment of the semiconductor device according to the present invention. In FIG. 19, those parts which are the same as those corresponding parts in FIG. 18 are designated by the same reference numerals, and a description thereof will be omitted.

A semiconductor device 220 shown in FIG. 19 has holes 221 formed in the upper extension 217 of the stage 213. In this embodiment, the stage 213 is buried inside the resin package 215 except for the upper extension 217. Even though only the upper extension 217 is exposed outside the resin package 215, it is still possible to improve the heat radiation efficiency compared to the conceivable semiconductor device 201 shown in FIG. 15.

Figure 33:
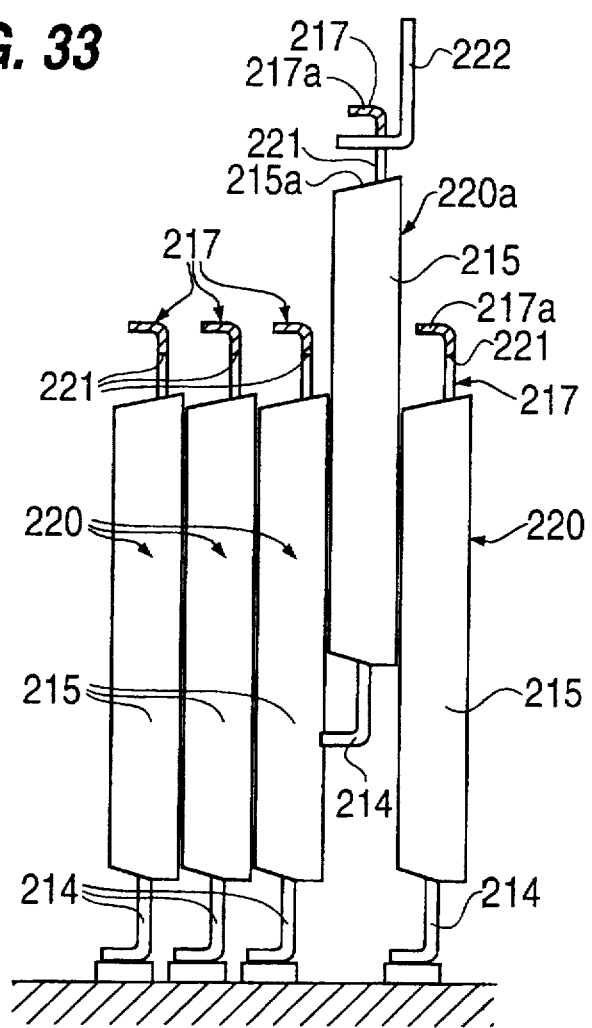
FIG. 33 is a cross sectional view for explaining the function of holes provided in the second embodiment of the semiconductor device.

When the holes 221 are formed in the upper extension 217, it is possible to engage a pull-out jig 222 with respect to the holes 221, as shown in FIG. 33. FIG. 33 shows a semiconductor device unit which is made up of 5 semiconductor devices 220 arranged in parallel in contiguous contact with each other.

When a plurality of semiconductor devices 220 are provided in contiguous contact with each other to form a unit, a defective semiconductor device 220a may be found as a result of a test. In this case, it is necessary to remove the defective semiconductor device 220a and to replace this defective semiconductor device 220a with a new semiconductor device 220.

If only the leads are exposed outside the resin package, it is difficult to extract only one defective semiconductor device from the plurality of semiconductor devices forming the unit.

But according to this embodiment, the upper extension 217 extends from the upper surface 215b of the resin package 215 of the semiconductor device 220, and the holes 221 are formed in the upper extension 217. Hence, it is possible to engage the pull-out jig 222 with respect to the holes 221, and the defective semiconductor device 220a can easily be pulled out and removed from the unit which is formed by the plurality of semiconductor devices 220. For this reason, the maintenance of the semiconductor device unit is facilitated. In addition, the holes 221 can be formed at the same time when forming the stage 213, and the process of producing the stage 213 will not become complex by the provision of the holes 221.

Figure 20:
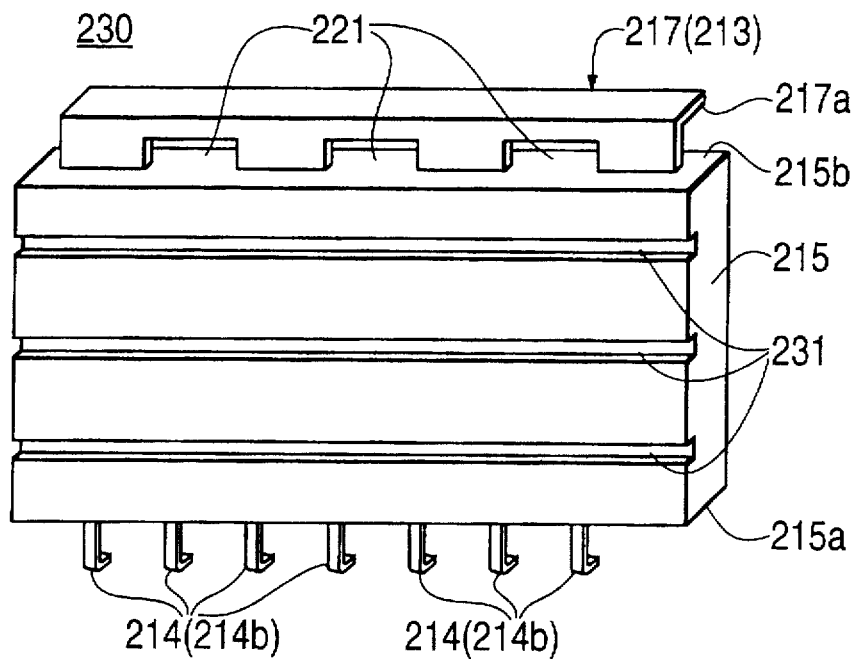
FIG. 20 is a perspective view showing a third embodiment of the semiconductor device according to the present invention.

FIG. 20 shows a third embodiment of the semiconductor device according to the present invention. In FIG. 20, those parts which are the same as those corresponding parts in FIGS. 18 and 19 are designated by the same reference numerals, and a description thereof will be omitted.

A semiconductor device 230 shown in FIG. 20 has 3 radiator grooves 231 formed on the surface of the resin package 215. As described above, the heat generated from the semiconductor chip 212 is radiated via the stage 213, and also conducts via the resin package 215. Hence, the heat is also radiated from the surface part of the resin package 215.

When a plurality of radiator grooves 231 are provided on the surface of the resin package 215 as in this embodiment, the surface area of the resin package 215 is increased, thereby improving the heat radiation efficiency of the resin package 215. Accordingly, it is possible to efficiently radiate the heat which is generated from the semiconductor chip 212 and conducts via the second heat conduction path, that is, the resin package 215. As a result, the cooling efficiency of the semiconductor chip 212 is improved.

Figure 21:
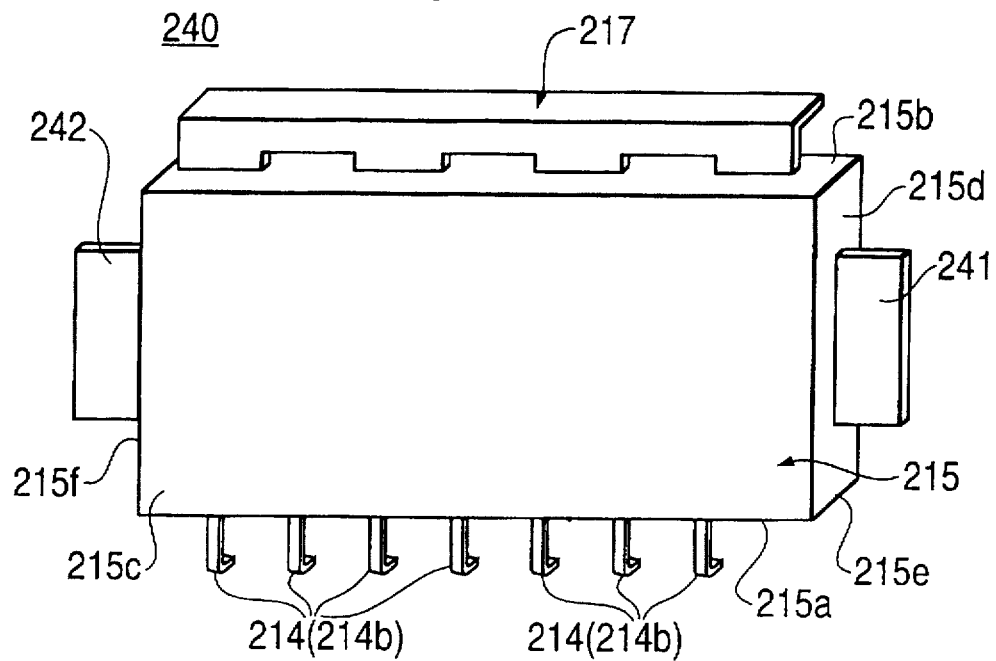
FIG. 21 is a perspective view showing a fourth embodiment of the semiconductor device according to the present invention.

FIG. 21 shows a fourth embodiment of the semiconductor device according to the present invention. In FIG. 21, those parts which are the same as those corresponding parts in FIGS. 18 and 19 are designated by the same reference numerals, and a description thereof will be omitted.

A semiconductor device 240 shown in FIG. 21 has side extensions 241 and 242 which respectively extend sideways (that is, extend to the sides) from vertical side surfaces 215e and 215f of the resin package 215. The side extensions 241 and 242 are integrally formed on the stage 213, similarly to the upper extension 217. The side extensions 241 and 242 are exposed outside the resin package 215.

By providing the side extensions 241 and 242 which are exposed outside the resin package 215 in addition to the upper extension 217, the heat generated from the semiconductor chip 212 is also radiated from the side extensions 241 and 242, thereby improving the cooling efficiency of the semiconductor chip 212. In addition, the pitch of the leads 214 can be maintained narrow at the lower surface 215a of the resin package 215, similarly to the first embodiment of the semiconductor device.

Figure 22:
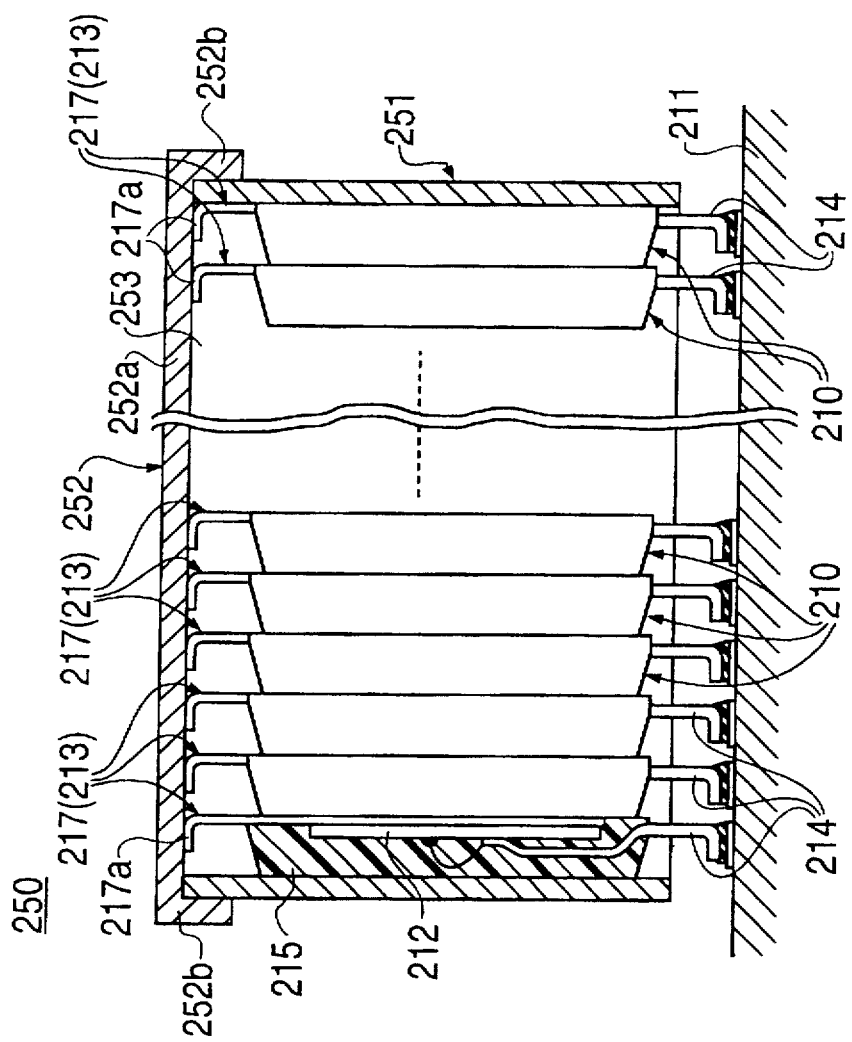
FIG. 22 is a cross sectional view showing a tenth embodiment of the semiconductor device unit according to the present invention.
Figure 23:
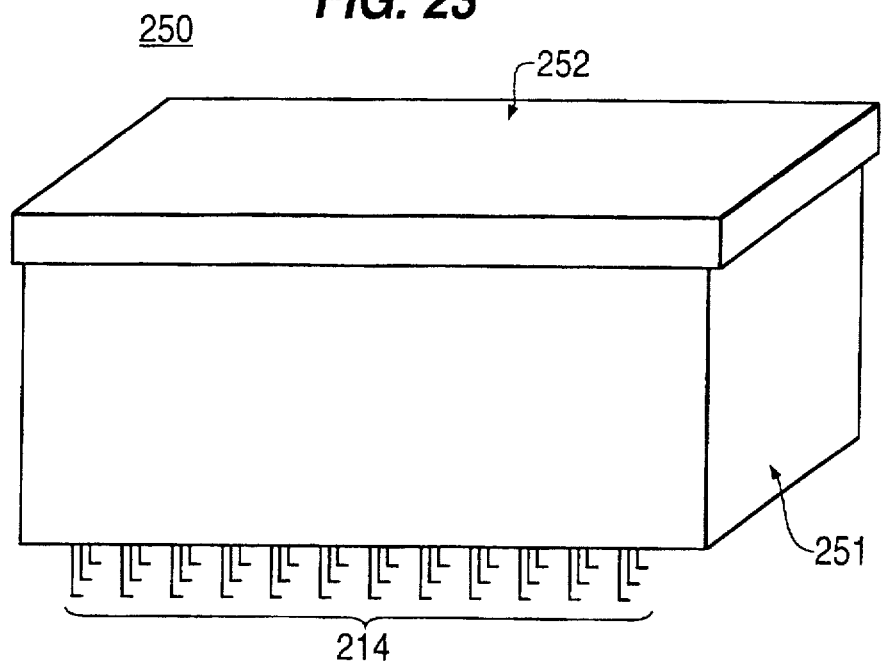
FIG. 23 is a perspective view showing the general construction of the tenth embodiment of the semiconductor device unit.

FIGS. 22 and 23 show a tenth embodiment of the semiconductor device unit according to the present invention.

A semiconductor device unit 250 shown in FIGS. 22 and 23 includes a plurality of semiconductor devices which are arranged in parallel in contiguous contact with each other, a holder 251 and a cap 252. Any one of the semiconductor devices 210, 220, 230 and 240 described above may be used for the semiconductor devices forming the semiconductor device unit 250. However, for the sake of convenience, it is assumed that the semiconductor devices 210 are used in this embodiment.

Figure 24:
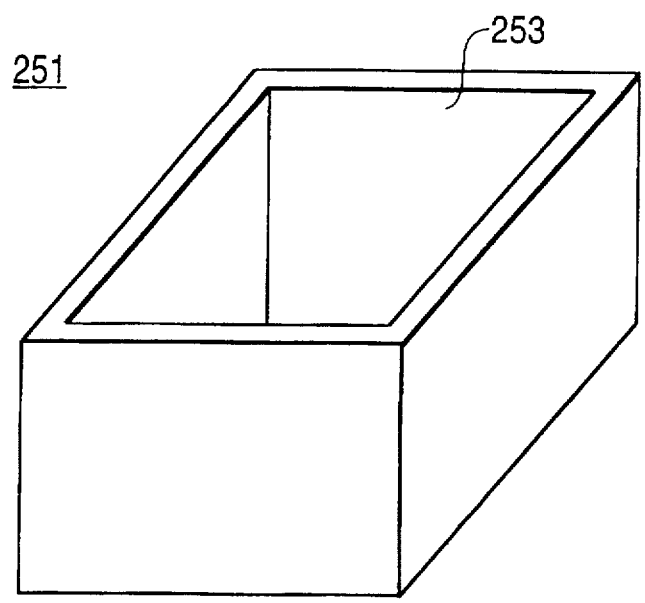
FIG. 24 is a perspective view on an enlarged scale showing a holder of the tenth embodiment of the semiconductor device unit.

The holder 251 is made of a material having a good heat conductance, such as aluminum and resins having a high heat conductance. As shown on an enlarged scale in FIG. 24, this holder 251 has a hollow rectangular column shape or a frame shape, and an upper opening 253 is formed at the top of the holder 251. A plurality of semiconductor devices 210 are accommodated within the holder 251 in a state where the semiconductor devices 210 are arranged in parallel. As shown in FIG. 22, each semiconductor device 10 accommodated within the holder 251 is arranged to face the same direction.

Figure 31:
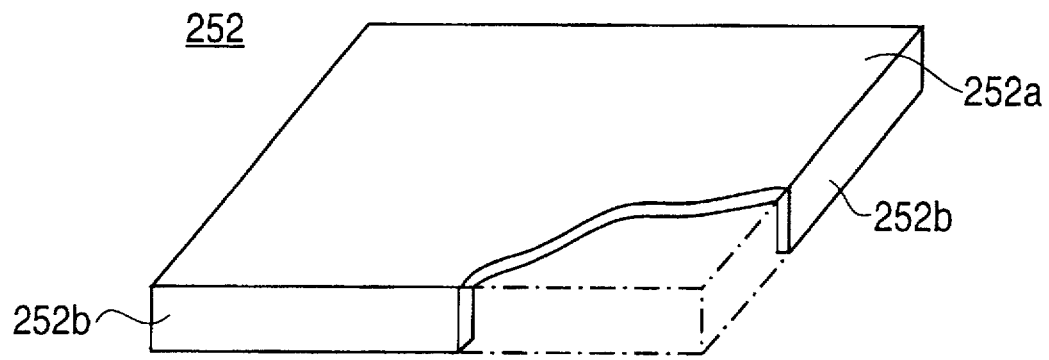
FIG. 31 is a perspective view on an enlarged scale showing a cap used in the tenth embodiment of the semiconductor device unit.

As shown in FIGS. 22 and 23, the cap 252 is fit on top of the holder 251, and this cap 252 closes the upper opening 253 of the holder 251. The cap 252 is also made of a material having a good heat conductance, such as aluminum and resins having a high heat conductance, similarly to the holder 251. In addition, as shown on an enlarged scale in FIG. 31, the cap 252 integrally has a top plate portion 252a and a flange portion 252b which surrounds the outer peripheral edge of the to plate portion 252a.

In a state where the cap 252 is fit on the holder 251, the upper extensions 217 of the semiconductor devices 210 accommodated within the holder 251 make contact with the cap 252. More particularly, the upper extensions 217 of the semiconductor devices 210 thermally connect to the cap 252 in the state where the cap 252 is fit on the holder 251. In addition, in the state where the cap 252 is fit on the holder 251, the flange portion 252b of the cap 252 fits around the holder 251. FIG. 23 generally shows the state where the cap 252 is fit on the holder 251.

Because the upper extensions 217 of the semiconductor devices 210 make contact with the cap 252 which closes the upper opening 253 of the holder 251, the heat generated from the semiconductor chips 212 conducts to the upper extensions 217 via the stages 213 and conducts to the cap 252 via the upper extensions 217. Because the bent portions 217a are formed at the tip ends of the upper extensions 217, the contact area between the cap 252 and the upper extensions 217 is relatively large, thereby satisfactorily conducting the heat from the upper extensions 217 to the cap 252.

The cap 252 has a relatively large surface area. In other words, the contact area of the cap 252 with respect to the surrounding air is relatively large. For this reason, even in the case of the semiconductor device unit 250 having the semiconductor devices 210 arranged in parallel in contiguous contact with each other, the heat generated from each semiconductor chip 212 can be radiated efficiently via the cap 252. As a result, the cooling efficiency of the semiconductor chips 212 is improved.

On the other hand, the heat generated from the semiconductor chip 212 also conducts via the resin package 215. Since the semiconductor devices 210 are accommodated within the holder 251 according to the semiconductor device unit 250, the heat conducted via the resin packages 215 is conducted to the holder 251. The holder 251 has a size and shape larger than those of the individual semiconductor device 210, and thus, the contact area of the holder 251 with respect to the surrounding air is large. Accordingly, the heat conducted via the resin packages 215 is efficiently radiated via the holder 251.

Furthermore, even if the heights of the semiconductor devices 210 accommodated within the holder 251 are inconsistent, it is possible to make the height of the semiconductor device unit 250 uniform by closing the upper opening 253 of the holder 251 by the cap 252. Hence, even if the space for accommodating the semiconductor device unit 250 within an electronic equipment housing is predetermined, it is possible to positively prevent a situation where the semiconductor devices cannot be mounted within the electronic equipment housing due to the inconsistent heights of the semiconductor devices.

Figure 25:
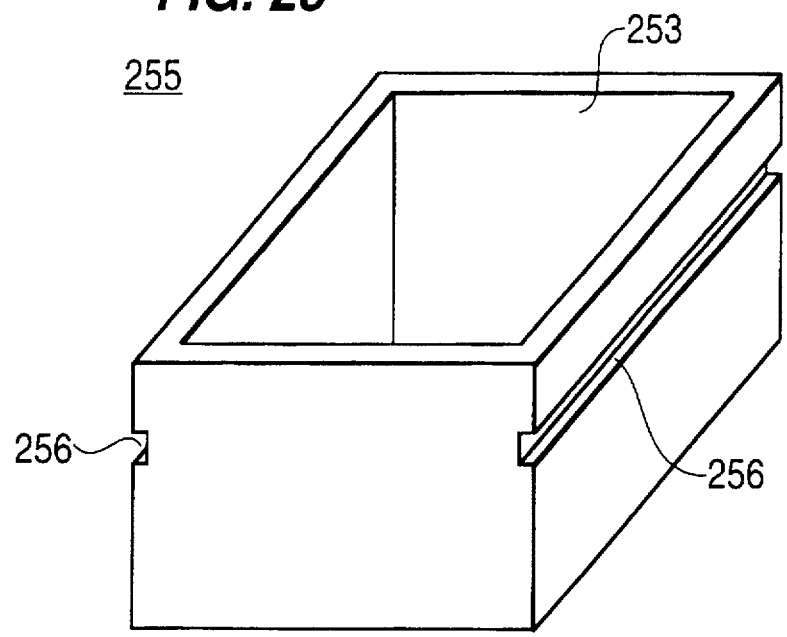
FIG. 25 is a perspective view showing a first modification of the holder of the tenth embodiment of the semiconductor device unit.

FIG. 25 shows a first modification of the holder which forms the semiconductor device unit 250.

Figure 32:
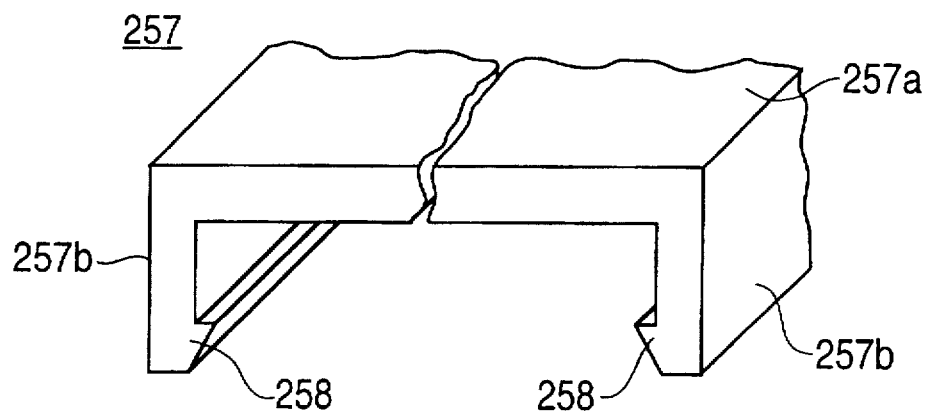
FIG. 32 is a perspective view on an enlarged scale showing a cap mounted on the first modification of the holder.

According to this first modification, a holder 255 has cap fitting grooves 256 formed on the outer wall portion of the holder 255. FIG. 32 shows a cap 257 which is fit on this holder 255. The cap 257 has slide claws 258 formed on the lower ends of the flange portion 257b on both sides along the longitudinal direction of the top plate portion 247a. The slide claws 258 engage the cap fitting grooves 256 of the holder 255 when the cap 257 is fit on the holder 255.

By using the holder 255 and the cap 257 having the above described construction, the cap 257 is fit on the holder 255 as follows. That is, the slide claws 258 is aligned to the cap fitting grooves 256, and the cap 257 is thereafter slid to fit the cap 257 on the holder 255. When removing the cap 257 from the holder 255 for maintenance purposes, for example, the cap 257 can easily be removed from the holder 255 by similarly sliding the cap 257.

Figure 26:
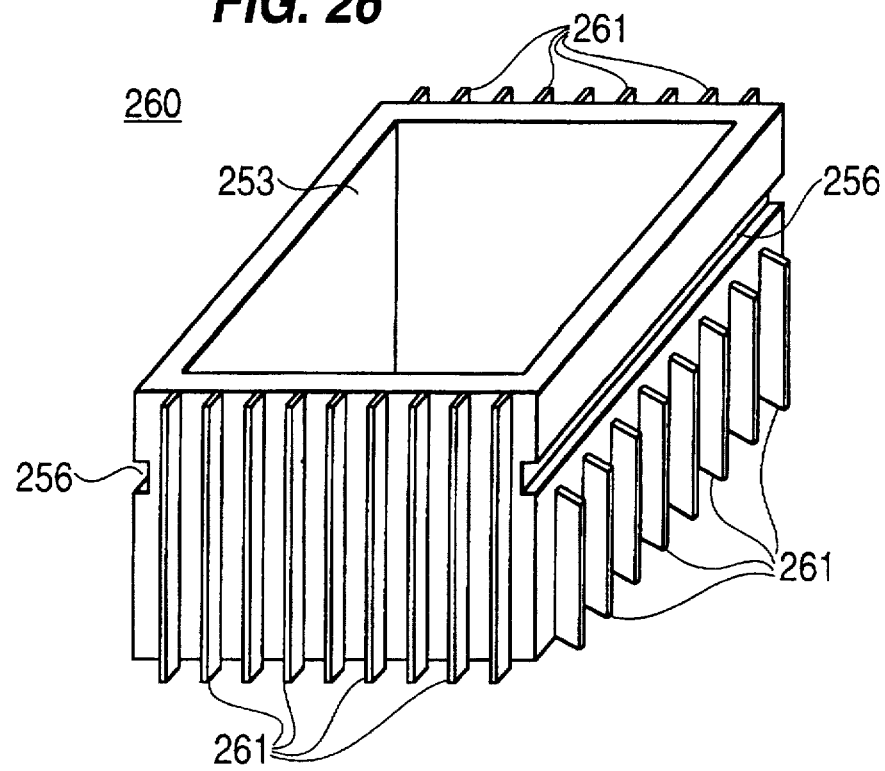
FIG. 26 is a perspective view showing a second modification of the holder of the tenth embodiment of the semiconductor device unit.

FIG. 26 shows a second modification of the holder which forms the semiconductor device unit 250.

According to this second modification, a holder 260 has a plurality of radiator fins 261 formed on the outer wall of the holder 260. By providing the large number of radiator fins 261 on the holder 260, the contact area of the holder 260 with respect to the surrounding air becomes large. As a result, it is possible to efficiently radiate the heat conducted via the resin package 215, and the cooling efficiency of the semiconductor chip 212 is improved.

Figure 27:
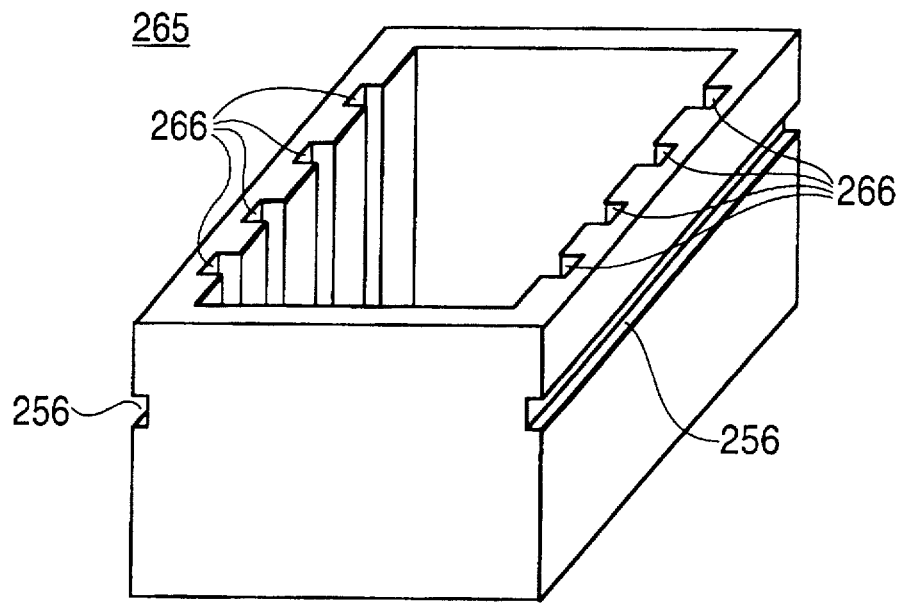
FIG. 27 is a perspective view showing a third modification of the holder of the tenth embodiment of the semiconductor device unit.

FIG. 27 shows a third modification of the holder which forms the semiconductor device unit 250.

According to this third modification, a holder 265 has holding grooves 266 which form a mechanism for holding the semiconductor devices 210 within the holder 265. The holding grooves 266 are shaped so that the resin packages 215 of the semiconductor devices 210 can be loaded into and extracted from the holder 265 by sliding the resin packages 215 with respect to the holding grooves 266.

By the provision of the holding grooves 266 in the holder 265, it is possible to positively hold the semiconductor devices 210 within the holder 265. In addition, it is possible to mount the semiconductor devices 210 within the holder 265 onto the circuit substrate 211 in the form of a unit, thereby improving the mounting ease. Further, the semiconductor devices 210 can be positively positioned within the holder 265 due to the provision of the holding grooves 266, so that the heights of the semiconductor devices 210 within the holder 265 can be aligned and the play of the semiconductor devices 210 within the holder 265 is prevented.

Figure 28:
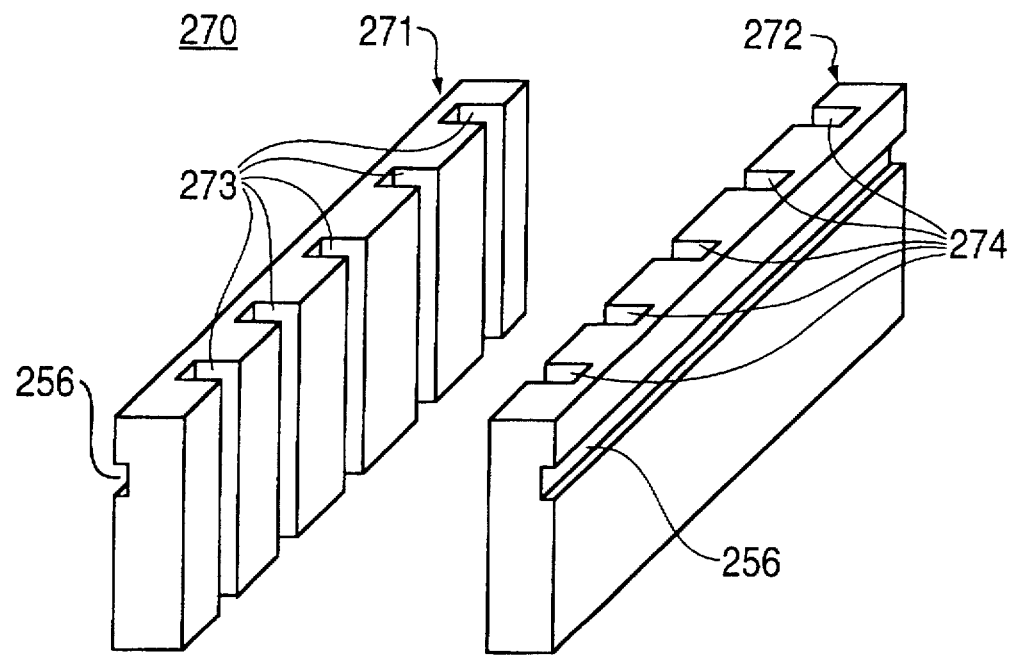
FIG. 28 is a perspective view showing a fourth modification of the holder of the tenth embodiment of the semiconductor device unit.

FIG. 28 shows a fourth modification of the holder which forms the semiconductor device unit 250.

According to this fourth modification, a holder 270 is made up of a pair of holder halves 271 and 272. Holding grooves 273 and 274 which engage the semiconductor devices 210 are respectively formed on confronting surfaces of the pair of holder halves 271 and 272.

By forming the holder 270 from the pair of holder halves 271 and 272, it becomes easy to form the holding grooves 273 and 274. In addition, compared to the hollow rectangular column shaped or frame shaped holder, it is possible to reduce the amount of material required to form the holder.

Even though the independent holder halves 271 and 272 are used, it is possible to rigidly connect the holder halves 271 and 272 by accommodating the semiconductor devices 210 between the holder halves 271 and 272 and fitting the cap 257 on top of the holder halves 271 and 272. Hence, no inconveniences are introduced by the use of the pair of holder halves 271 and 272 to form the holder 270.

Figure 29:
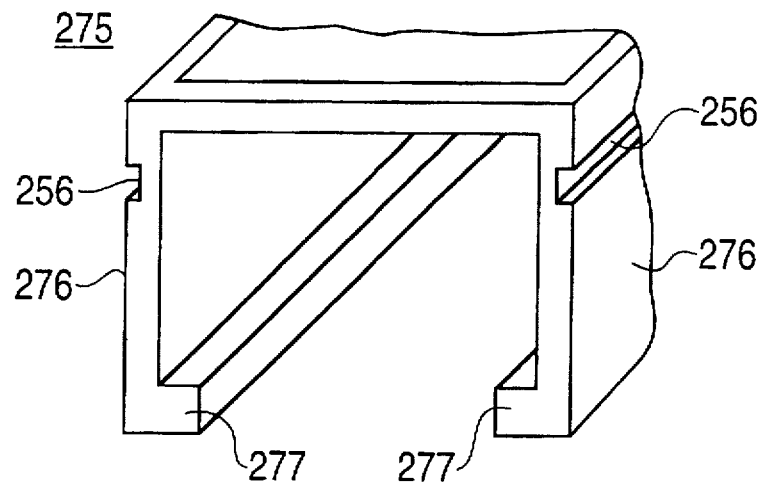
FIG. 29 is a perspective view showing a fifth modification of the holder of the tenth embodiment of the semiconductor device unit.

FIG. 29 shows a fifth modification of the holder which forms the semiconductor device unit 250.

According to this fifth modification, a holder 275 has engaging claws 277 which project towards the inside at lower ends of side walls 276 of the holder 275. In a state where the semiconductor devices 210 are accommodated within the holder 275, the engaging claws 277 engage the lower surfaces 215a of the resin packages 215. Accordingly, by loading the semiconductor devices 210 into the holder 275 and contacting the lower surfaces 215a of the resin packages 215 to the engaging claws 277, it is possible to accurately align the heights of the semiconductor devices 210.

Figure 30:
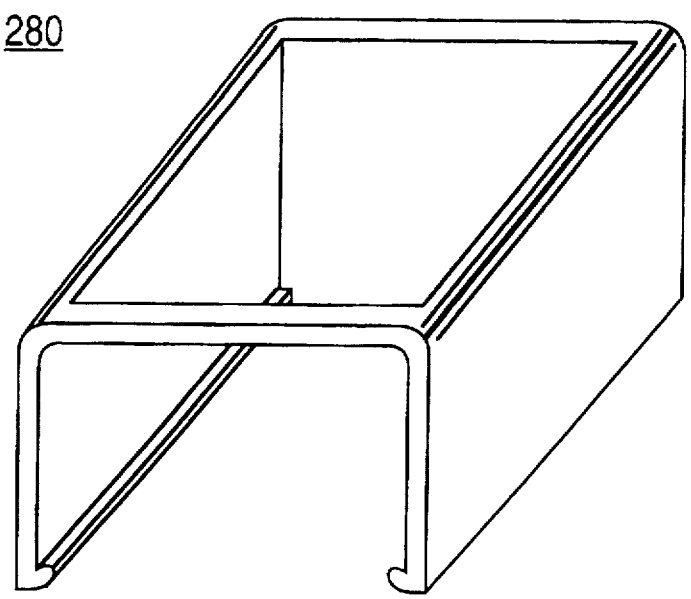
FIG. 30 is a perspective view showing a sixth modification of the holder of the tenth embodiment of the semiconductor device unit.

FIG. 30 shows a sixth modification of the holder which forms the semiconductor device unit 250.

According to this sixth modification, a holder 280 is press-formed from a single plate. By press-forming the holder 280 from the single plate, it becomes possible to simply produce the holder 280 at a low cost.

Figure 34:
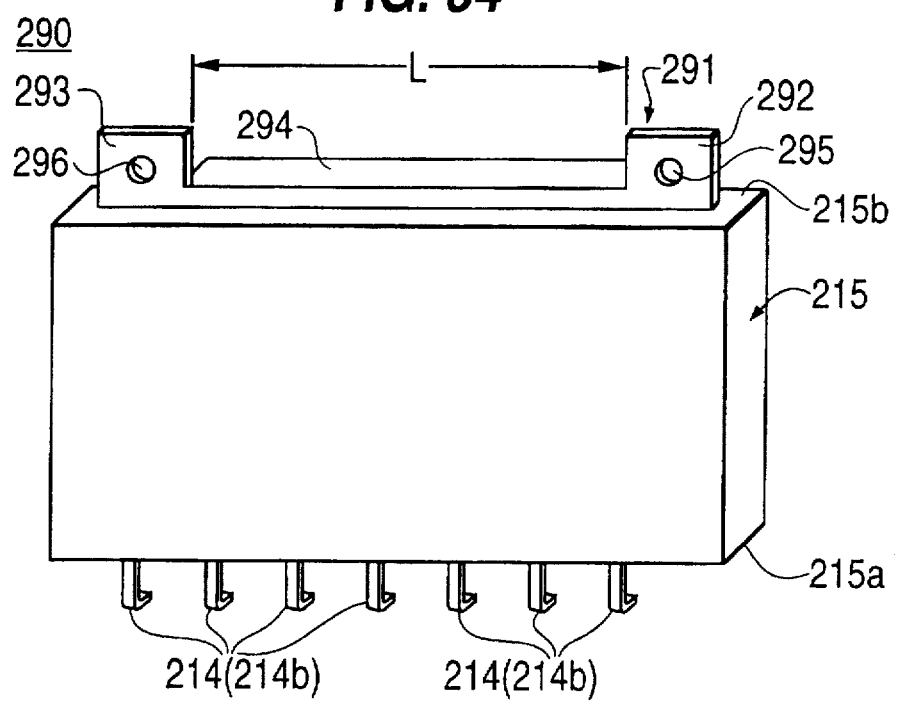
FIG. 34 is a perspective view showing a fifth embodiment of the semiconductor device according to the present invention.

FIG. 34 shows a fifth embodiment of the semiconductor device according to the present invention. In FIG. 34, those parts which are the same as those corresponding parts in FIG. 18 are designated by the same reference numerals, and a description thereof will be omitted.

A semiconductor device 290 shown in FIG. 34 has an upper extension 291 which extends from the upper portion of the resin package 215 formed on the stage 213. The upper extension 291 includes vertical portions 292 and 293, and a positioning groove 294.

The vertical portions 292 and 293 are formed on both sides of the upper extension 291, and extend vertically upwards from the upper surface 215b of the resin package 215. Positioning holes 295 and 296 are respectively formed in the vertical portions 292 and 293. A portion between the vertical portions 292 and 293 is bent so as to form the positioning groove 294. A length L of the positioning groove 294 along the longitudinal direction of the resin package 215, that is, the distance between the vertical portions 292 and 293, is set to a predetermined value with a high precision. In addition, the positioning holes 295 and 296 are formed in the vertical portions 292 and 293 at predetermined positions with a high precision.

Figure 42B:
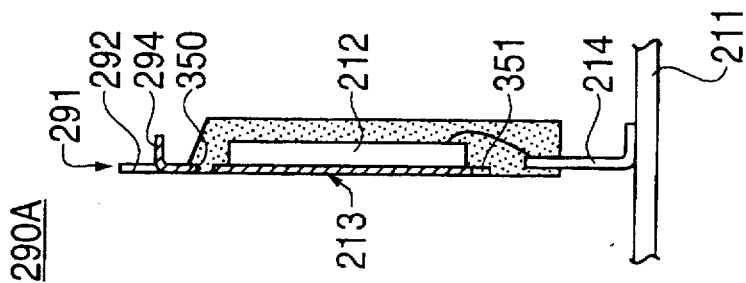
FIGS. 42A and 42B respectively are a front view and a cross sectional view showing a modification of the fifth embodiment of the semiconductor device.
Figure 42A:
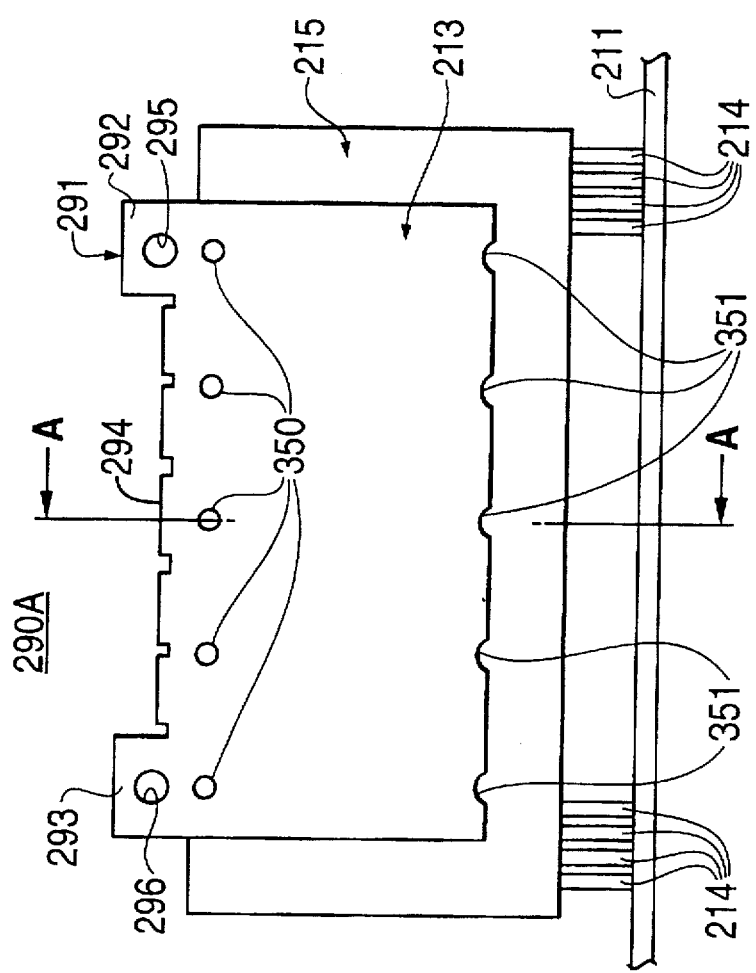

FIGS. 42A and 42B respectively show a modification of the semiconductor device 290. FIG. 42A shows a rear view of a semiconductor device 290A, and FIG. 42B shows a cross section of the semiconductor device 290A along a line A—A in FIG. 42A. In FIGS. 42A and 42B, those parts which are the same as those corresponding parts in FIG. 34 are designated by the same reference numerals, and a description thereof will be omitted.

As described above, the stage 213 is exposed outside the resin package 215 in order to improve the heat radiation. Hence, the stage 213 is made of a metal, and the bonding strength of the stage 213 with respect to the resin package 215 is not very strong. For this reason, the stage 213 may separate from the resin package 215.

Hence, in this modification of the fifth embodiment of the semiconductor device, improved bonding portions are provided on the stage 213 in order to improve the bonding strength between the stage 213 and the resin package 215. In other words, resin engaging holes 350 and resin engaging depressions 351 are provided on the stage 213 as the improved bonding portions.

By providing the resin engaging holes 350 and the resin engaging depressions 351 in the stage 213, it is possible to increase the contact area between the stage 213 and the resin package 215. In addition, the so-called anchor effect occurs because the resin forming the resin package 215 enters within the resin engaging holes 350 and the resin engaging depressions 351. As a result, the bonding strength between the stage 213 and the resin package 215 is improved, and it is possible to positively prevent the stage 213 from separating from the resin package 215.

The improved bonding portions are of course not limited to the resin engaging holes 350 and the rein engaging depressions 351. For example, it is possible to form projections on the stage 213 or form grooves in the stage 213.

Figure 35:
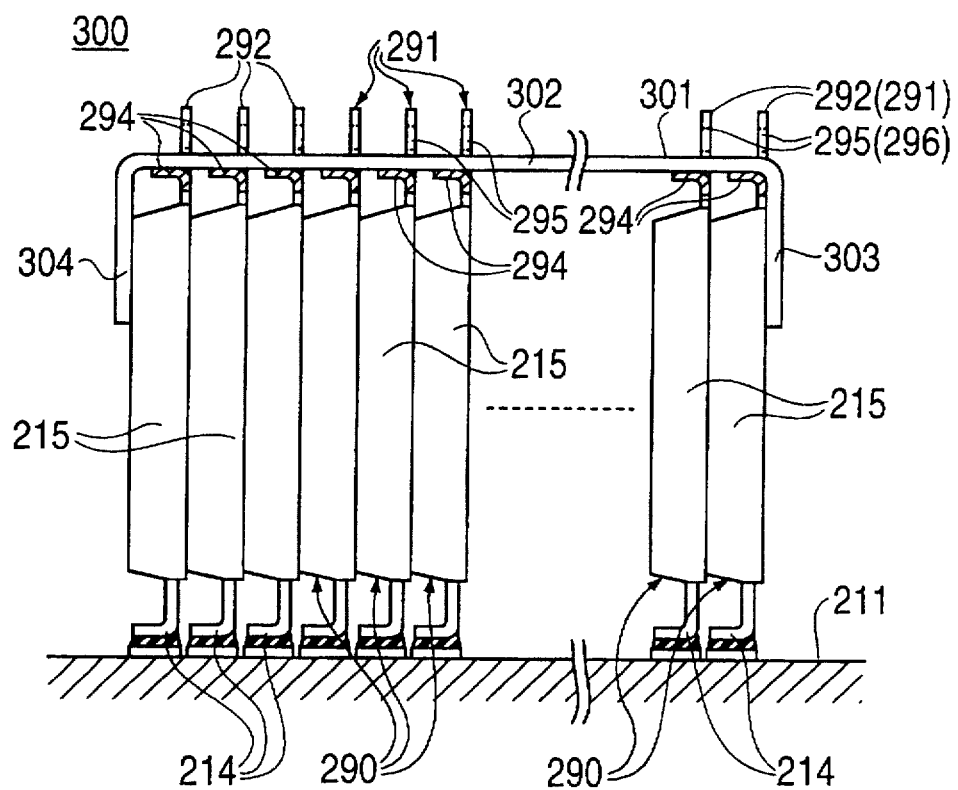
FIG. 35 is a cross sectional view showing the general construction of an eleventh embodiment of the semiconductor device unit according to the present invention.

FIG. 35 shows an eleventh embodiment of the semiconductor device unit according to the present invention. In FIG. 35, those parts which are the same as those corresponding parts in FIG. 34 are designated by the same reference numerals, and a description thereof will be omitted.

A semiconductor device unit 300 shown in FIG. 35 includes a holder 301, and a plurality of semiconductor devices 190 shown in FIG. 34 which are arranged in parallel within the holder 301. The holder 301 has a generally upsidedown U-shape when viewed from the side.

The holder 301 integrally has an upper surface portion 302, and a pair of side surface portions 303 and 304. The width of the upper surface portion 302 accurately matches the distance L between the pair of vertical portions 292 and 293 provided on the semiconductor device 290. In addition, a distance between the pair of side surface portions 303 and 304, that is, the length of the positioning groove 294, is set slightly less than or equal to the total sum of the widths of the semiconductor devices 290 accommodated within the holder 301.

When loading the semiconductor devices 290 into the holder 301, the upper surface portion 302 of the holder 301 fit into the positioning groove 294, that is, between the pair of vertical portions 292 and 293, and the pair of side surface portions 303 and 304 sandwich the semiconductor devices 290 from both sides. Thus, the semiconductor devices 290 are held by the pair of side surface portions 303 and 304, thereby forming a unit. In addition, the semiconductor devices 290 are positioned when the upper surface portion 302 of the holder 301 fit into the positioning groove 294.

In the case of the semiconductor device unit 250 shown in FIGS. 22 and 23 described above, the positioning of each semiconductor device 210 within the holder 251 is made when the side surface of the resin package 215 of each semiconductor device 210 makes contact with the inner wall of the holder 251. However, if a molding error of the resin package 215 occurs with respect to the leads 214 during the resin molding process in which the resin package 215 is formed, each semiconductor device 210 will be aligned within the holder 251 along the resin package 215 which is deviated from the regular position. In this case, the positioning accuracy of the leads 214 which are arranged at an extremely small pitch may deteriorate.

On the other hand, according to the semiconductor device unit 300, the upper surface portion 302 fits into the positioning groove 294 to position each of the semiconductor devices 290 within the holder 301. But as described above, the width of the upper surface portion 302 accurately matches the distance L of the positioning groove 294 provided on the semiconductor device 290. In addition, since the stage 213 and the leads 214 are press-formed from a single lead material or substrate, and the positioning of the stage 213 and the leads 214 is highly accurate. Therefore, by positioning the stage 213 of each semiconductor device 290 by fitting the upper surface portion 302 into the positioning groove 294, it is possible to simultaneously position the leads 214.

Accordingly, in the semiconductor device unit 300, each semiconductor device 290 is positioned not by positioning the resin package 215 but by positioning the stage 213. For this reason, the positions where the leads 214 are arranged will not become inconsistent, and the mounting ease and accuracy of the semiconductor devices 290 on the circuit substrate 211 is improved. In addition, according to the semiconductor device unit 300, it is unnecessary to surround the periphery of the semiconductor devices 290 as in the case of the semiconductor device unit 250 shown in FIGS. 22 and 23, and there is no need to provide a cap on the holder 301. For this reason, it is possible to reduce both the size and cost of the holder 301, and hence reduce both the size and cost of the semiconductor device unit 100 as a whole.

Figure 36:
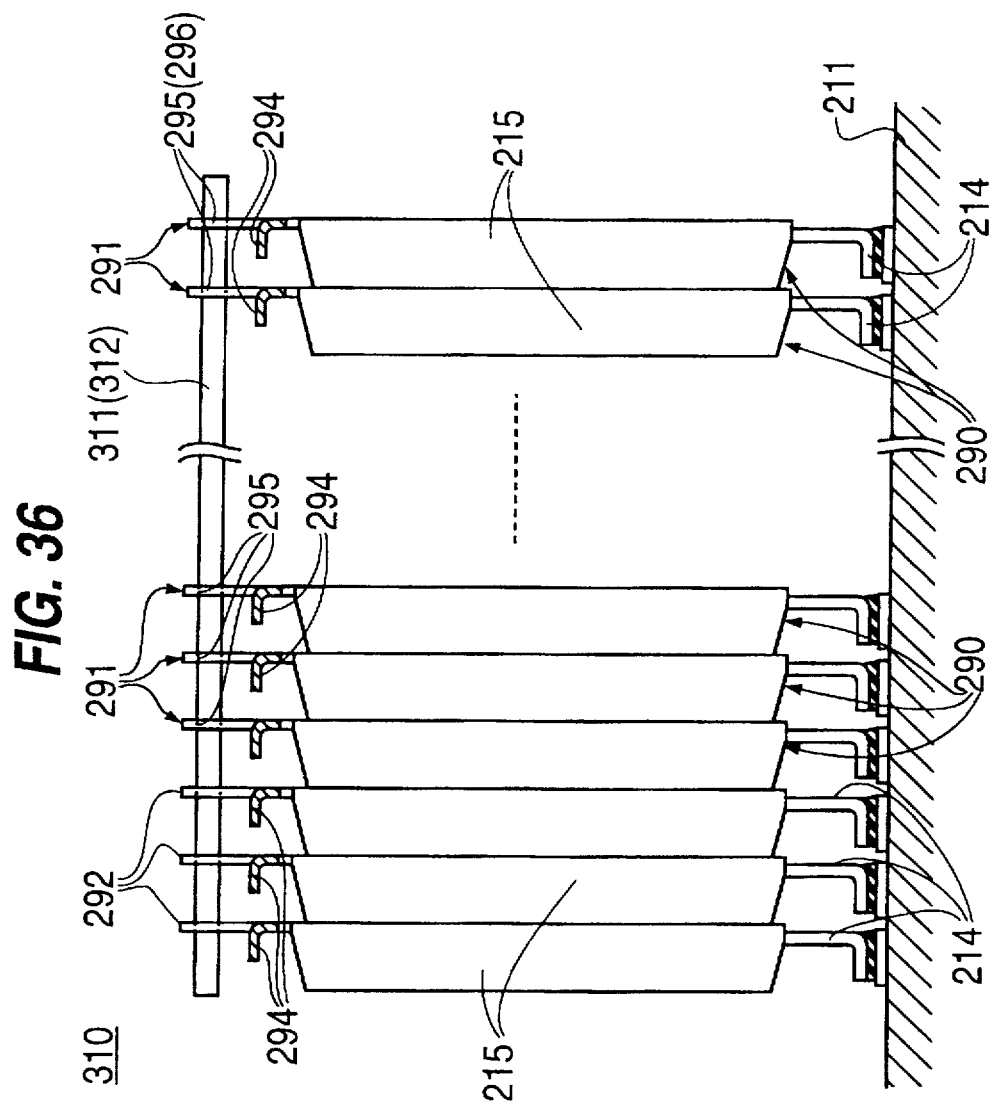
FIG. 36 is a cross sectional view showing the general construction of a twelfth embodiment of the semiconductor device unit according to the present invention.

FIG. 36 shows a twelfth embodiment of he semiconductor device unit according to the present invention. In FIG. 36, those parts which are the same as those corresponding parts in FIG.35 are designated by the same reference numerals, and a description thereof will be omitted.

A semiconductor device unit 310 shown in FIG. 36 includes a plurality of semiconductor devices 290 shown in FIG. 34, and positioning shafts 311 and 312 which respectively penetrate the positioning holes 295 and 296 in the vertical portions 292 and 293 of the semiconductor devices 290. Only the positioning shaft 311 is shown in FIG. 36.

The positioning shafts 311 and 312 have a diameter such that the positioning shafts 311 and 312 can respectively penetrate the positioning holes 295 and 296 in the vertical portions 292 and 293. In addition, as described above, the positioning accuracy of the positioning holes 295 and 296 in the vertical portions 292 and 293 is high, and the stage 213 and the leads 214 are positioned with a high accuracy. Hence, by inserting the positioning shafts 311 and 312 through the respective positioning holes 295 and 296 in each of the semiconductor devices 290 which are arranged in parallel, the semiconductor devices 290 are positioned and, at the same time, the semiconductor devices 290 are fixed to form a unit.

The positioning of the semiconductor devices 290 and the integration of the semiconductor devices 290 into the semiconductor device unit 310 can be carried out simultaneously by the simple operation of inserting the positioning shafts 311 and 312 into the positioning holes 295 and 296. As a result, it is possible to greatly simplify the process of producing the semiconductor device unit 310. In addition, since the semiconductor device unit 310 can be formed by the mere use of two positioning shafts 311 and 312, it is possible to reduce the cost of the semiconductor device unit 310.

Figure 37:
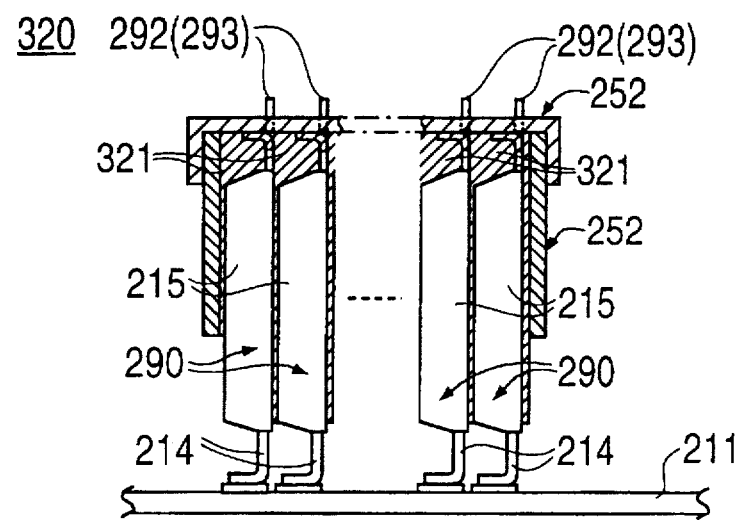
FIG. 37 is a cross sectional view showing the general construction of a thirteenth embodiment of the semiconductor device unit according to the present invention.

FIG. 37 shows a thirteenth embodiment of the semiconductor device unit according to the present invention. In FIG. 37, those parts which are the same as those corresponding parts in FIGS. 22 and 34 are designated by the same reference numerals, and a description thereof will be omitted.

A semiconductor device unit 320 shown in FIG. 37 includes the holder 251 which is used in the semiconductor device unit 250 shown in FIG. 22 described above, and the semiconductor devices 290 shown in FIG. 34 which are arranged in parallel within the holder 251. Since the semiconductor device 290 has the vertical portions 292 and 293, the cap 252 which is fit on top of the holder 251 is provided with penetration holes which are penetrated by the vertical portions 292 and 293. Hence, the vertical portions 292 and 293 project above the cap 252 by penetrating the penetration holes in the cap 252.

A bonding or adhesive agent 321 fills a space between the semiconductor devices 290 and the cap 252, and a space between each two mutually adjacent semiconductor devices 290. The bonding agent 321 has a high heat conductance.

Thus, at least the adjacent semiconductor devices 290 are held together by the bonding agent 321, and the bonded semiconductor devices 290 which are arranged in parallel improve the strength of the semiconductor device unit 320 as a whole.

For example, a thermoplastic resin is used as the bonding agent 321. Hence, by carrying out a thermal process to raise the temperature of the bonding agent 321 above the heat plasticization temperature, the bonding agent 321 softens and the semiconductor devices 290 become movable.

In the semiconductor device unit 320, the bonding agent 321 having the high heat conductance is provided in the space between the adjacent semiconductor devices 290 and in the space between the cap 252 and the semiconductor devices 290. Hence, the heat generated from the semiconductor devices 290 is conducted to the holder 251 and the cap 252 via the bonding agent 321, and the heat radiation or cooling efficiency of the semiconductor devices 290 is improved.

The adjacent semiconductor devices 290 are held together by the bonding agent 321, and the bonded semiconductor devices 290 which are arranged in parallel improve the strength of the semiconductor device unit 320 as a whole. Therefore, the reliability of the semiconductor device unit 320 is improved.

Figure 38:
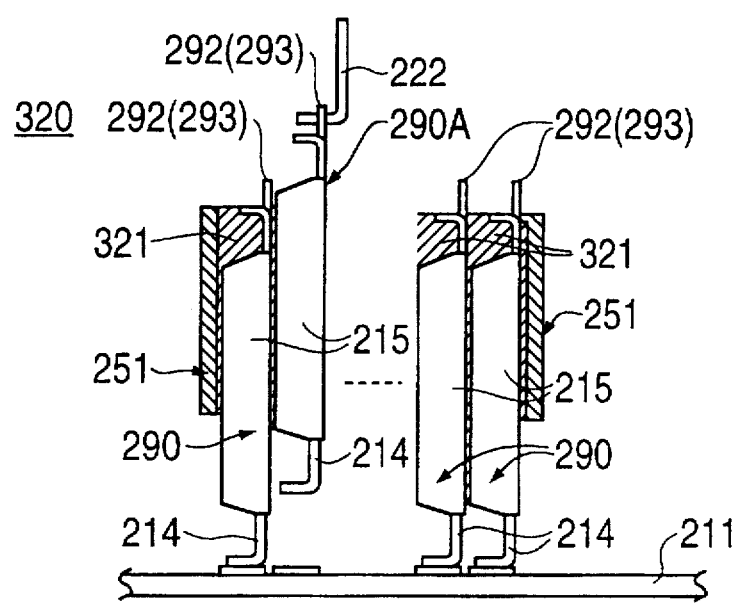
FIG. 38 is a cross sectional view for explaining a state where a defective semiconductor device is changed in the thirteenth embodiment of the semiconductor device unit.

Furthermore, even if a semiconductor device 290A within the holder 251 fails after it is held by the bonding agent 321 together with the other semiconductor devices 290, it is possible to easily remove and replace this defective semiconductor device 290A. In this case, a thermal process is carried out to raise the temperature of the bonding agent 321 above the heat plasticization temperature, so that the bonding agent 321 softens. As shown in FIG. 38, the defective semiconductor device 290A is removed from the semiconductor device unit 320 using the pull-out jig 222 and replaced by a new semiconductor device 290. As a result, both the ease of the maintenance and the reliability of the semiconductor device unit 320 are improved.

Figure 39:
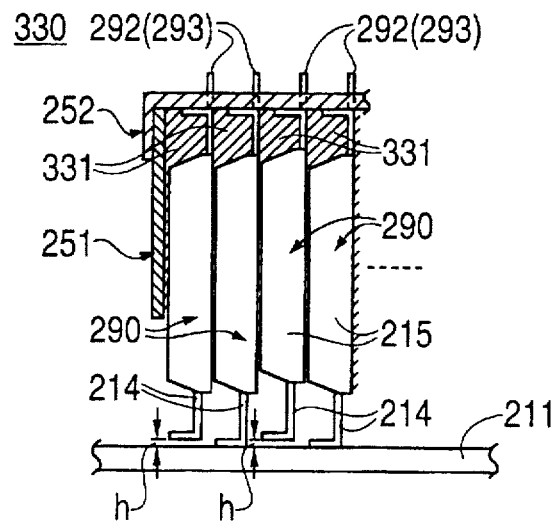
FIG. 39 is a cross sectional view showing the general construction of a fourteenth embodiment of the semiconductor device unit according to the present invention.

FIG. 39 shows a fourteenth embodiment of the semiconductor device unit according to the present invention. In FIG. 39, those parts which are the same as those corresponding parts in FIG. 37 are designated by the same reference numerals, and a description thereof will be omitted.

A semiconductor device unit 330 shown in FIG. 39 has a construction similar to that of the semiconductor device unit 320 shown in FIGS. 37 and 38. However, in the semiconductor device unit 330, a silicon grease 331 is used in place of the bonding agent 321. This silicon grease 331 has a high viscosity under room temperature, and has a relatively high heat conductance.

When producing the semiconductor devices 290, the heights of the leads 214 may become slightly inconsistent due to production error. In FIG. 39, an error h exists between the heights of the leads 214 due to the production error. Hence, when the semiconductor device unit 330 is mounted (soldered) as it is onto the circuit substrate 211 in the state where the error h exists between the heights of the leads 214, a satisfactory electrical connection may not be obtained between the leads 214 and the circuit substrate 211.

But in the semiconductor device unit 330, the space between the cap 252 and the semiconductor devices 290 and the space between the adjacent semiconductor devices 290 are filled by the silicon grease 331 which has the high viscosity at room temperature. For this reason, even in the state where the semiconductor devices 290 are accommodated within the holder 251 of the semiconductor device unit 330, it is possible to move each semiconductor device 290 up and down within the holder 251 by applying a relatively large force on the semiconductor device 290.

Figure 40:
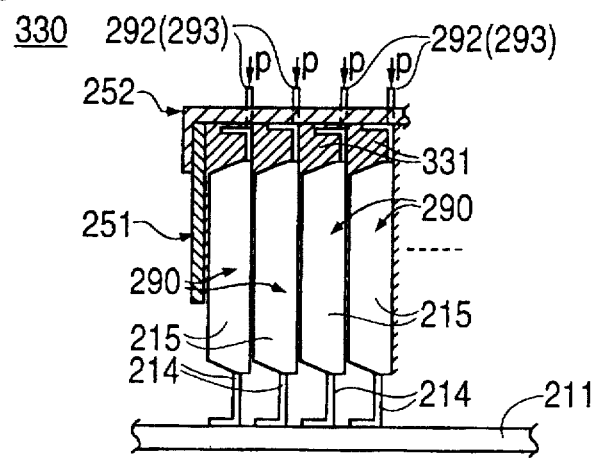
FIG. 40 is a cross sectional view for explaining a method of correcting a height error in the fourteenth embodiment of the semiconductor device unit.

Accordingly, by applying a downward pressing force P on the vertical portions 292 and 293 which project upwards from the cap 252 as shown in FIG. 40, so as to move the semiconductor devices 90 downwards, it is possible to correct the error h between the heights of the leads 214 described above in conjunction with FIG. 39. As a result, the leads 214 of all of the semiconductor devices 290 make contact with the circuit substrate 211, and all of the leads positively make satisfactory electrical contact with the circuit substrate 211. Of course, a defective semiconductor device can be removed and replaced by a new semiconductor device also in this embodiment, even after the semiconductor devices 290 are accommodated within the holder 251.

Figure 41:
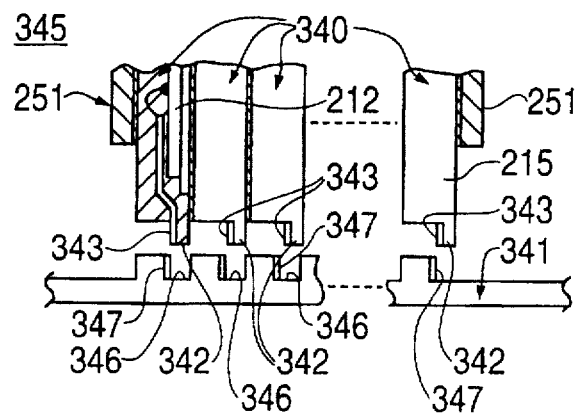
FIG. 41 is a cross sectional view showing the general construction of a sixth embodiment of the semiconductor device and a fifteenth embodiment of the semiconductor device unit according to the present invention.

FIG. 41 shows a sixth embodiment of the semiconductor device according to the present invention. In FIG. 41, those parts which are the same as those corresponding parts in FIG.18 are designated by the same reference numerals, and a description thereof will be omitted. For the sake of convenience, FIG. 41 shows on an enlarged scale a vicinity of a part where a semiconductor device 340 and a circuit substrate 341 are connected. A plurality of such semiconductor devices 340 are arranged in parallel within the holder 251 to form a semiconductor device unit 345.

In this embodiment, a holding part 342 is provided on the resin package 215 of the semiconductor device 340. In addition, a downwardly extending portion of each lead 343 is held by this holding part 342.

Unlike the other embodiments described above, the downwardly extending portion of the lead 343 in this embodiment is not bent in the L-shape but has a straight shape. In addition, a projection is formed on the lower portion of the resin package 215 by the provision of the holding part 342. Furthermore, the lead 342 is exposed at the inner side surface of the holding part 342.

On the other hand, a cavity 346 is formed in the circuit substrate 341 at positions corresponding to the holding parts 342 of the semiconductor devices 340 which form the semiconductor device unit 345. The cavity 346 has a shape corresponding to the shape of the holding art 342, and a substrate side electrode 347 is formed at a predetermined position on the inner surface of the cavity 346.

When mounting the semiconductor device unit 345 on the circuit substrate 341, the holding parts 342 at the lower portion of the semiconductor device unit 345 are fitted into the corresponding cavities 346 in the circuit substrate 341. In this state, the leads 343 provided on the holding part 342 make electrical contact to the substrate side electrodes 347 provided in the corresponding cavities 346. In addition, by the press-fit connection of the holding parts 342 and the corresponding cavities 346, the semiconductor device unit 345 is secured on the circuit substrate 341.

The leads 343 and the substrate side electrodes 347 make sliding contact when the semiconductor device unit 345 is mounted on the circuit substrate 341. However, because the leads 343 are held by the holding parts 342 and the substrate side electrodes 347 are fixed on the inner walls of the cavities 346, the leads 343 and the substrate side electrodes 347 will not be deformed during this mounting process. In addition, since the leads 343 are held by the holding parts 342, it is possible to prevent unwanted deformation of the leads 343 also when the semiconductor devices 340 are accommodated within the holder 251.

The semiconductor device unit 345 and the circuit substrate 341 are connected by fitting the holding parts 342 into the corresponding cavities 346 so that the leads 343 make sliding contact with the substrate side electrodes 347 as described above. In other words, no fixing process such as soldering is carried out. For this reason, the semiconductor device unit 345 is detachably mounted with respect to the circuit substrate 341, thereby improving the each of maintenance. In addition, it is also possible to selectively mount semiconductor device units 345 having different functions with respect to the circuit substrate 341.

Figure 43:
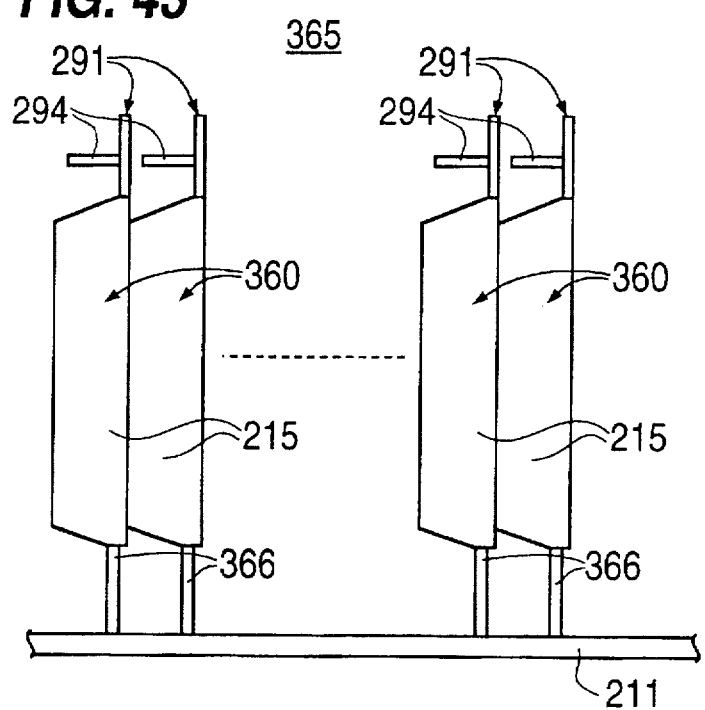
FIG. 43 is a side view showing a seventh embodiment of the semiconductor device and a sixteenth embodiment of the semiconductor device unit according to the present invention.
Figure 44:
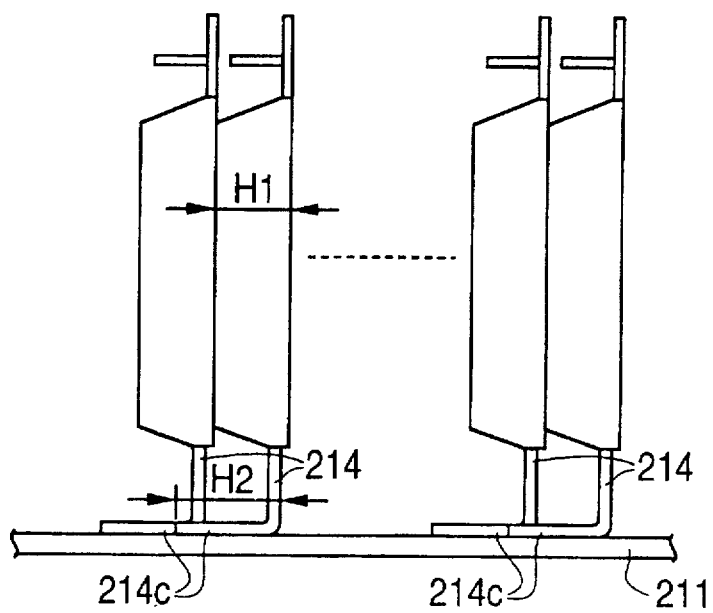
FIG. 44 is a side view for explaining the effects of the seventh embodiment of the semiconductor device.

FIG. 43 shows a seventh embodiment of the semiconductor device according to the present invention. In FIG. 43, those parts which are the same as those corresponding parts in FIG. 36 are designated by the same reference numerals, and a description thereof will be omitted.

A semiconductor device 360 shown in FIG. 43 has leads 366 having a straight shape. A plurality of such semiconductor devices 360 are arranged in parallel to form a semiconductor device unit 365. By use of such semiconductor devices 360, it is possible to reduce the size of the semiconductor device unit 365 as will be described hereinafter.

In order to reduce the size of the semiconductor device 360 and the thickness of the semiconductor device 360 in particular, it is effective to reduce the thickness of the resin package 215. Recently, semiconductor devices called chipsize packages have also been proposed, wherein the size of the resin package 215 is approximately the same as that of the semiconductor chip 212.

When the resin package 215 is made thin, the bent portions of the leads 214 may interfere with each other among the resin packages 215 when the semiconductor devices are arranged in parallel, even if the resin packages 215 do not interfere with each other.

In other words, in a case where a thickness H1 of the resin package 215 is smaller than a length H2 of the bent portion of the lead 214, bent portions 214c of the leads 214 will make contact with each other, thereby making it impossible to arrange the semiconductor devices in contiguous contact with each other.

But in this embodiment, the leads 366 have the straight shape. As a result, the thickness of the lead 366 can be made smaller than the thickness of the resin package 215, and the high density arrangement of the semiconductor devices 360 will not be hindered by the shape of the leads 366. Therefore, it is possible to reduce the size of the semiconductor device unit 365 which is formed by the semiconductor devices 360 that are arranged in parallel.

Further, the present invention is not limited to these embodiments, but various variations and modifications may be made without departing from the scope of the present invention.

What is claimed is:

1. A semiconductor device adapted to be surface mounted on a circuit substrate in an approximate vertical position, said semiconductor device comprising:

a semiconductor chip;

a stage having a first surface and a second surface opposite to the first surface, said semiconductor chip being directly mounted on the first surface and said second surface defining a back plane of the semiconductor device such that substantially none of the semiconductor device extends beyond the second surface;

a resin package encapsulating said semiconductor chip with the second surface of the stage not being covered by the encapsulation, said resin package having upper and lower surfaces and side surfaces extending from the upper to the lower surfaces, one of the side surfaces of the resin package being substantially planar, to match the second surface of the stage and enable stacking of semiconductor devices;

a plurality of leads respectively having one end electrically connected to said semiconductor chip and another end extending downwardly from the lower surface of said resin package and being curved for surface mounting connection on a circuit substrate;

an upper extension, provided on said stage, extending upwardly from the upper surface of said resin package; and a side extension, provided on said stage, extending sideways from the side surface of said resin package.

2. The semiconductor device as claimed in claim 1, wherein said upper extension has at least one hole.

3. The semiconductor device as claimed in claim 1, which further comprises:

bonding means bonding said stage with respect to said resin package.

4. The semiconductor device as claimed in claim 1, which further comprises:

at least one radiator groove provided on said resin package.

5. The semiconductor device as claimed in claim 1 which further comprises:

a pair of vertical portions provided vertically on both sides of said stage; and a positioning groove provided between said pair of vertical portions.

6. The semiconductor device as claimed in claim 1, wherein ends of said leads extending downwardly from the lower surface of said resin package are held by said resin package.

7. The semiconductor device as claimed in claim 1, wherein ends of said leads extending downwardly from the lower surface of said resin package have an approximate L-shape.

8. The semiconductor device as claimed in claim 1, wherein ends of said leads extending downwardly from the lower surface of said resin package have a straight shape.

9. A semiconductor device adapted to be mounted on a circuit substrate in an approximate vertical position, said semiconductor device comprising:
   a semiconductor chip;
   a stage having a first surface and a second surface opposite to the first surface, said semiconductor chip being mounted on the first surface;
   a resin package encapsulating said semiconductor chip, said resin package having upper and lower surfaces and side surfaces;
   a plurality of leads respectively having one end electrically connected to said semiconductor chip and another end extending downwardly from the lower surface of said resin package;
   an upper extension, provided on said stage, extending upwardly from the upper surface of said resin package;
   a pair of vertical portions provided vertically on both sides of said stage;
   a positioning groove provided between said pair of vertical portions; and
   a positioning hole provided in each of said pair of vertical portions.

10. A semiconductor device unit comprising:
    a holder having an upper portion with an opening; and
    a plurality of semiconductor devices arranged in parallel at approximately vertical positions within said holder,
    each of said semiconductor devices comprising:
      a semiconductor chip;
      a stage having a first surface and a second surface opposite to the first surface, said semiconductor chip being mounted on the first surface;
      a resin package encapsulating said semiconductor chip, said resin package having upper and lower surfaces and side surfaces;
      a plurality of leads respectively having one end electrically connected to said semiconductor chip and another end extending downwardly from the lower surface of said resin package; and
      an upper extension, provided on said stage, extending upwardly from the upper surface of said resin package.

11. The semiconductor device unit as claimed in claim 10, which further comprises:
    a cap closing the opening of said holder and making contact with the upper extension of each of said semiconductor devices within said holder.

12. The semiconductor device unit as claimed in claim 11, wherein said holder and said cap are made of a material having a good heat conductance.

13. The semiconductor device unit as claimed in claim 10, which further comprises:
    holding means holding said semiconductor devices within said holder by engaging with said semiconductor devices.

14. The semiconductor device unit as claimed in claim 10, wherein said holder has an outer wall portion, and said semiconductor device unit further comprises at least one radiator fin provided on the outer wall portion of said holder.

15. The semiconductor device unit as claimed in claim 10, which further comprises:
    engaging claws provided on said holder and holding said semiconductor devices by engaging with the bottom surface of each resin package.

16. The semiconductor device unit as claimed in claim 11, wherein said cap has an upper surface portion, and said semiconductor device unit further comprises at least one radiator fin provided on the upper surface portion of said cap.

17. The semiconductor device unit as claimed in claim 10, wherein:
    each of said semiconductor devices further comprise:
      pair of vertical portions provided vertically on both sides of said stage; and
      a positioning groove provided between said pair of vertical portions,
    and said holder comprises:
      an upper surface portion; and
      a pair of side surface portions provided on both sides of said upper surface portion,
    said upper surface portion fitting into the positioning groove of each of said semiconductor devices to collectively position said semiconductor devices,
    said side surface portions sandwiching said semiconductor devices in parallel arrangement.

18. The semiconductor device unit as claimed in claim 10, which further comprises:
    a bonding agent having a high heat conduction and holding at least adjacent semiconductor devices together.

19. The semiconductor device unit as claimed in claim 18, wherein said bonding agent is selected from a group consisting of thermoplastic materials and silicon grease.

20. A semiconductor device unit comprising:
    at least one positioning shaft; and
    a plurality of semiconductor devices arranged in parallel at approximately vertical positions,
    each of said semiconductor devices comprising:
      a semiconductor chip;
      a stage having a first surface and a second surface opposite to the first surface, said semiconductor chip being mounted on the first surface;
      a resin package encapsulating said semiconductor chip, said resin package having upper and lower surfaces and side surfaces;
      a plurality of leads respectively having one end electrically connected to said semiconductor chip and another end extending downwardly from the lower surface of said resin package;
      an upper extension, provided on said stage, extending upwardly from the upper surface of said resin package;
      a pair of vertical portions provided vertically on both sides of said stage;
      a positioning groove provided between said pair of vertical portions; and
      a positioning hole provided in each of said pair of vertical portions,
    said positioning shaft penetrating the positioning hole in each of said semiconductor devices to collectively position said semiconductor devices.

21. The semiconductor device unit as claimed in claim 20, which further comprises:
    a bonding agent having a high heat conduction and holding at least adjacent semiconductor devices together.

22. The semiconductor device unit as claimed in claim 21, wherein said bonding agent is selected from a group consisting of thermoplastic materials and silicon grease.

* * * * *

UNITED STATES PATENT AND TRADEMARK OFFICE
CERTIFICATE OF CORRECTION

PATENT NO. : 5,786,985
DATED : July 28, 1998
INVENTOR(S) : TANIGUCHI et al.

It is certified that error appears in the above-indentified patent and that said Letters Patent is hereby corrected as shown below:

Col. 4, line 40, change "eight" to --eighth--.

Col. 9, line 49, change "device" to --devices--.

Col. 12, line 44, change "ad" to --and--.

Col. 17, line 30, change "rein" to --resin--.

Col. 18, line 38, change "he" to --the--.

Signed and Sealed this

Fifth Day of January, 1999

Attest:

Attesting Officer

Acting Commissioner of Patents and Trademarks